(12) United States Patent
Choi et al.

(10) Patent No.: US 12,406,905 B2
(45) Date of Patent: Sep. 2, 2025

(54) SEMICONDUCTOR DEVICES

(71) Applicant: SAMSUNG ELECTRONICS CO., LTD., Suwon-si (KR)

(72) Inventors: Suhyeong Choi, Suwon-si (KR); Jiwook Kwon, Suwon-si (KR); Byungju Kang, Suwon-si (KR); Chulhong Park, Suwon-si (KR); Kwanyoung Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 412 days.

(21) Appl. No.: 18/113,133

(22) Filed: Feb. 23, 2023

(65) Prior Publication Data

US 2023/0378027 A1    Nov. 23, 2023

(30) Foreign Application Priority Data

May 19, 2022   (KR) .......................... 10-2022-0061379

(51) Int. Cl.
*H01L 23/48*   (2006.01)
*H01L 23/522*   (2006.01)

(52) U.S. Cl.
CPC ........ *H01L 23/481* (2013.01); *H01L 23/5226* (2013.01)

(58) Field of Classification Search
CPC ............... H01L 23/481; H01L 23/5226; H01L 23/5286; H01L 23/5283; H10D 89/10
See application file for complete search history.

(56) References Cited

U.S. PATENT DOCUMENTS

| | | | |
|---|---|---|---|
| 10,510,774 B2 | 12/2019 | Debacker et al. | |
| 10,886,224 B2 | 1/2021 | Gerousis et al. | |
| 11,158,580 B2 | 10/2021 | Sio et al. | |
| 2002/0105049 A1 | 8/2002 | Barney et al. | |
| 2021/0118798 A1 | 4/2021 | Liebmann et al. | |
| 2021/0118805 A1* | 4/2021 | Sio .......................... | H01L 24/19 |
| 2021/0225768 A1 | 7/2021 | Peng et al. | |
| 2021/0366895 A1 | 11/2021 | Chang et al. | |
| 2021/0374318 A1 | 12/2021 | Yang et al. | |
| 2021/0391318 A1 | 12/2021 | Peng et al. | |

* cited by examiner

*Primary Examiner* — Julia Slutsker
(74) *Attorney, Agent, or Firm* — Morgan, Lewis & Bockius LLP

(57) ABSTRACT

A semiconductor device includes: a semiconductor substrate having power arrangement regions; a first interconnection structure disposed on the semiconductor substrate and including first interconnection patterns and power lines; a second interconnection structure disposed on the semiconductor substrate and including second interconnection patterns; and through-electrodes passing through each of the power arrangement regions and contacting the power lines, wherein the first interconnection patterns include first interconnection lines, wherein the power lines are disposed on a same height level as a first interconnection line, among the first interconnection lines, and are parallel to each other, wherein the power arrangement regions are parallel to each other, and wherein intersection regions, in which the power arrangement regions and the power lines intersect, include a plurality of first active intersection regions, one dummy intersection region, and a plurality of second active intersection regions, sequentially arranged.

20 Claims, 17 Drawing Sheets

SEMICONDUCTOR DEVICES

CROSS-REFERENCE TO RELATED APPLICATION

This application claims benefit of priority under 35 U.S.C. 119(a) to Korean Patent Application No. 10-2022-0061379 filed on May 19, 2022 in the Korean Intellectual Property Office, the disclosure of which is incorporated by reference herein in its entirety.

TECHNICAL FIELD

The present inventive concept relates to a semiconductor device.

DISCUSSION OF THE RELATED ART

As demand for semiconductor devices having high performance, high speed, and/or multifunctionality increases, a degree of integration of the semiconductor devices is increasing. With the trend for increased integration of semiconductor devices, research into designing a layout, particularly for efficient routing of interconnections for connecting semiconductor devices to one another, is being actively conducted.

SUMMARY

An aspect of the present inventive concept is a semiconductor device having an increased degree of integration and electrical performance.

According to an example embodiment of the present inventive concept, a semiconductor device includes: a semiconductor substrate having a first surface and a second surface, opposing each other, and having power arrangement regions; a circuit element disposed on the semiconductor substrate; a first interconnection structure disposed on the first surface of the semiconductor substrate and including first interconnection patterns and power lines; a second interconnection structure disposed on the second surface of the semiconductor substrate and including second interconnection patterns; insulating structures disposed in the power arrangement regions; and through-electrodes passing through each of the power arrangement regions and contacting the power lines, wherein the first interconnection patterns include first interconnection lines disposed on different levels from each other, wherein the power lines are disposed on a same height level as a first first interconnection line, among the first interconnection lines, and are parallel to each other, wherein the power lines extend in a first horizontal direction, wherein the power arrangement regions are parallel to each other and extend in a second horizontal direction, substantially perpendicular to the first horizontal direction, and wherein, in a plan view, intersection regions in which the power arrangement regions and the power lines intersect include active intersection regions and dummy intersection regions, wherein the active intersection regions and the dummy intersection regions include a plurality of first active intersection regions, one dummy intersection region, and a plurality of second active intersection regions, sequentially arranged in the second horizontal direction, and wherein, in a plan view, the through-electrodes are disposed in the active intersection regions and are not disposed in the dummy intersection regions.

According to an example embodiment of the present inventive concept, a semiconductor device includes: a semiconductor substrate having a first surface and a second surface, opposing each other, and including power arrangement regions parallel to each other and extending in a second horizontal direction, substantially perpendicular to a first horizontal direction; a circuit element disposed on the semiconductor substrate; a front interconnection structure disposed on the first surface of the semiconductor substrate and including front interconnection patterns and power lines, a rear interconnection structure disposed on the second surface of the semiconductor substrate and including rear interconnection patterns; and through-electrodes passing through at least the semiconductor substrate in the power arrangement regions, and contacting the power lines, wherein the front interconnection patterns include front interconnection lines disposed on different levels from each other, wherein the power lines are disposed on a same height level as a first front interconnection line, among the front interconnection lines, and are parallel to each other, wherein the power lines extend in the first horizontal direction, wherein, in a plan view, intersection regions, in which the power arrangement regions and the power lines intersect each other, include a pair of active intersection regions and a dummy intersection region, alternately and repeatedly arranged in the second horizontal direction, and wherein, in a plan view, the through-electrodes are disposed in the active intersection regions and are not disposed in the dummy intersection region.

According to an example embodiment of the present inventive concept, a semiconductor device includes: a semiconductor substrate having a first surface and a second surface, opposing each other, and having power arrangement regions; a circuit element disposed the semiconductor substrate; a front interconnection structure disposed on the first surface of the semiconductor substrate and including front interconnection patterns and power lines; a rear interconnection structure disposed on the second surface of the semiconductor substrate and including rear interconnection patterns; insulating structures disposed on the first surface of the semiconductor substrate and in the power arrangement regions; and through-electrodes passing through each of the power arrangement regions and contacting the power lines, wherein the front interconnection patterns include front interconnection lines disposed on different levels from each other, wherein the power lines are disposed on a same height level as a first front interconnection line, among the front interconnection lines, and are parallel to each other, wherein the power lines extend in a first horizontal direction, wherein the power arrangement regions are parallel to each other and extend in a second horizontal direction, substantially perpendicular to the first horizontal direction, and wherein, in through-electrodes sequentially arranged in the second horizontal direction, among the through-electrodes, a pair of through-electrodes spaced apart from each other by a first interval are repeatedly arranged at a second interval, greater than the first interval.

BRIEF DESCRIPTION OF DRAWINGS

The above and other aspects of the present inventive concept will become more apparent by describing in detail example embodiments thereof, with reference to the accompanying drawings, in which.

DETAILED DESCRIPTION OF THE EMBODIMENTS

Hereinafter, example embodiments of the present inventive concept will be described with reference to the accompanying drawings.

Figure 1:
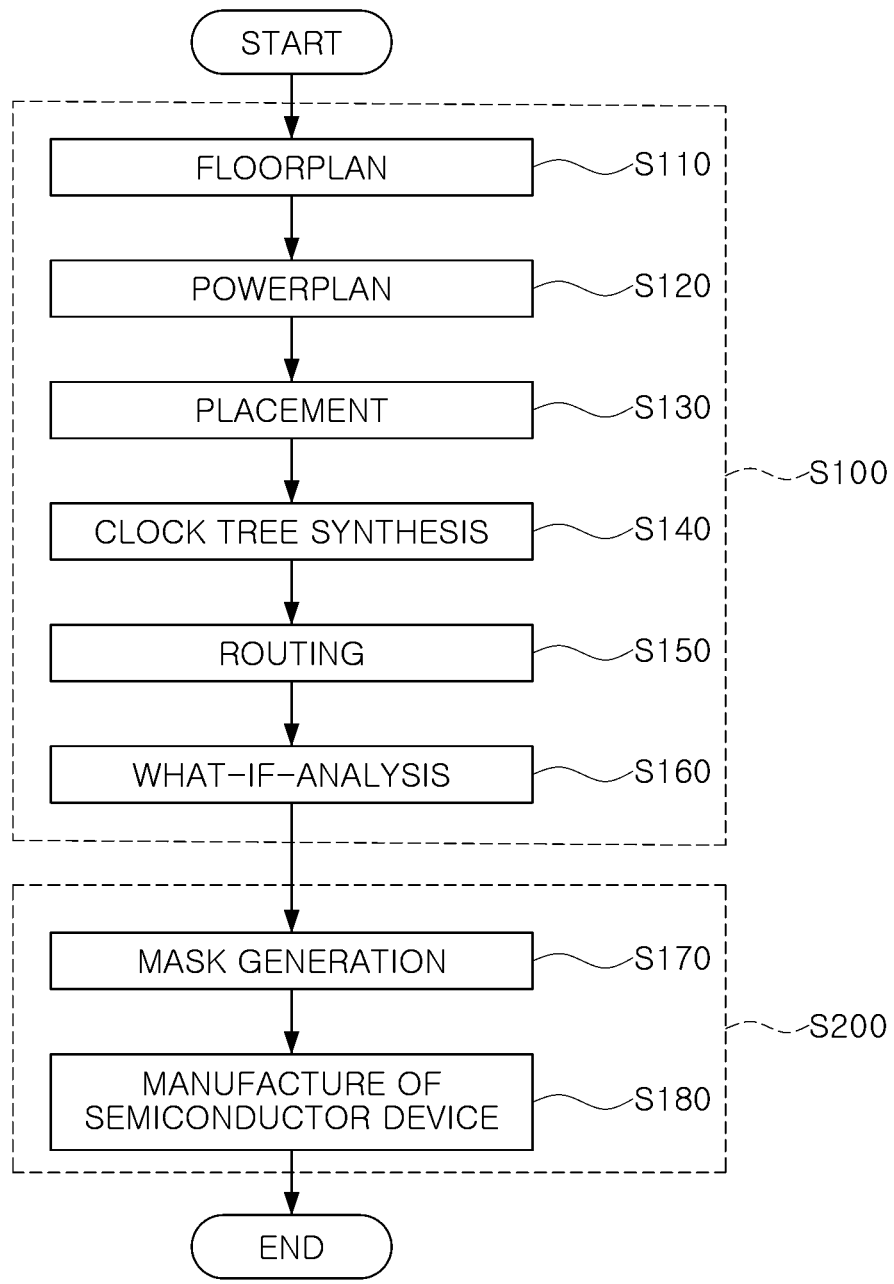
FIG. 1 is a flowchart illustrating a method of designing and manufacturing a semiconductor device according to an example embodiment of the present inventive concept.

FIG. 1 is a flowchart illustrating a method of designing and manufacturing a semiconductor device according to an example embodiment of the present inventive concept.

Referring to FIG. 1, a method of designing and manufacturing a semiconductor device according to an example embodiment of the present inventive concept may include designing a semiconductor device (S100), and manufacturing the semiconductor device (S200).

The designing of a semiconductor device (S100) may include designing a layout for a circuit, and may be performed using a tool for designing the circuit. The tool may be a program including a plurality of instructions executed by a processor. Therefore, the designing of a semiconductor device (S100) may be a computer implementation for designing the circuit. The manufacturing of the semiconductor device (S200) may include manufacturing the semiconductor device according to the designed layout based on the designed layout, and may be performed in a semiconductor process module.

First, the designing of a semiconductor device (S100) may include floorplan (S110), powerplan (S120), placement (S130), clock tree synthesis (CTS) (S140), routing (S150), and what-if-analysis (S160).

The floorplan (S110) may include an operation of physically designing a logically designed schematic circuit by cutting and moving the same. In the floorplan (S110), a memory or a functional block (e.g., a circuit) may be disposed. In this operation, for example, functional blocks to be disposed adjacent to each other, may be identified, and a space for the functional blocks may be allocated in consideration of an available space, for performance, or the like. For example, the floorplan (S110) may include generating a site-row and forming a metal routing track in the generated site-row. The site-row may be a frame for arranging standard cells stored in a cell library according to a prescribed design rule. Standard cells respectively having the same height as each other may be arranged in each row. Standard cells in some rows may provide a site for arranging the standard cells to have a height, different from that of standard cells in other rows. The metal routing track may be an imaginary line on which interconnections are formed later.

The powerplan (S120) may be an operation of disposing patterns of interconnections connecting a local power source, for example, a driving voltage or a ground, to the disposed functional blocks. For example, patterns of interconnections connecting power or ground may be generated such that the power is uniformly supplied to an entire chip in the form of a net. In this specification, the patterns may also be referred to as a power rail or a power line. In this operation, the interconnections may be generated through various rules. For example, the interconnections may be formed to have a linear shape in which the power line extends to be spaced apart from each other on a semiconductor substrate.

The placement (S130) may be an operation of disposing patterns of elements constituting the functional block, and may include disposing standard cells. For example, in an example embodiment of the present inventive concept, each of the standard cells may include semiconductor devices and first interconnection lines connected thereto. The first interconnection lines may include a power transmission line connecting to a power source or a ground, and an interconnection line transmitting a control signal, an input signal, or an output signal. Empty regions may be generated between the standard cells disposed in this operation, and the empty regions may be filled by filler cells. Unlike standard cells including an operable semiconductor device, unit circuits implemented with semiconductor devices, or the like, the filler cells may be dummy regions. By this operation, a shape or a size of a pattern for constituting transistors and interconnections to be actually formed on the semiconductor substrate may be defined. For example, to actually form an inverter circuit on the semiconductor substrate, it is possible to appropriately arrange layout patterns such as a PMOS, an NMOS, an N-WELL, a gate electrode, and interconnections to be disposed thereon. In an example embodiment of the present inventive concept, power tap cells may be disposed between the standard cells and/or the filler cells disposed in this operation, but according to an embodiment of the present inventive concept, the power tap cells may be disposed before this operation in a different configuration.

In a semiconductor device according to an example embodiment of the present inventive concept, standard cells having a constant height may be arranged in a row in a first horizontal direction (e.g., the X-direction), and a power tap cell connected to a power line between the standard cells may be disposed. In an example embodiment of the present inventive concept, the power tap cells may be cells in which an electrical connection path, which is for connecting an interconnection (e.g., a power line) on the semiconductor substrate to an interconnection (e.g., a power distribution network) below the semiconductor substrate, is disposed.

The CTS (S140) may be an operation of generating patterns of signal lines of a central clock related to a response time that determines performance of the semiconductor device.

The routing (S150) may be an operation of generating an upper interconnection structure and a lower interconnection structure or a routing structure, including second interconnection lines connecting the arranged standard cells. For example, a power distribution network (PDN) may be implemented in this operation. The second interconnection lines may be electrically connected to the first interconnection lines in the standard cells, and may electrically connect the standard cells to each other, or may be connected to a power source or a ground. A portion of the second interconnection lines, for example, the routing structure, may be configured to be physically formed on the first interconnection lines, and a remaining portion of the second interconnection lines, for example, the power distribution network, may be configured to be formed below the semiconductor substrate.

In an example embodiment of the present inventive concept, after the routing (S150), a timing closure operation may be performed. The timing closure operation may be an operation of further modifying a layout, in consideration of constraints such as a response time or the like after the routing (S150) is completed. The timing closure operation may be the last operation of physical design for generating the layout.

The what-if-analysis (S160) may be an operation of verifying and correcting the generated layout. For example, the what-if-analysis (S160) may be a physical verification and sign off operation. Items to be verified may include a design rule check (DRC) verifying whether the layout is correctly in accordance with a design rule, an electronical rule check (ERC) verifying whether the layout is correct without electrical breakage, a layout-vs-schematic (LVS) checking whether the layout matches a gate level net list, or the like.

Subsequently, the semiconductor device manufacturing process (S200) may include mask generation (S170) and manufacturing of a semiconductor device (S180).

The mask generation (S170) may include an operation of generating mask data for forming various patterns on a plurality of layers by performing optical proximity correction (OPC), or the like on the layout data generated in the designing of a semiconductor device (S100), and an operation of manufacturing a mask using the mask data. The optical proximity correction may be for correcting distortion that may occur in a photolithography process. The mask may be manufactured in a manner that depicts layout patterns using a thin chrome film applied on a glass or quartz substrate.

In the manufacture of a semiconductor device (S180), various types of exposure and etching processes may be repeatedly performed. Through these processes, shapes of patterns configured during layout design may be sequentially formed on a semiconductor substrate such as silicon. For example, various semiconductor processes may be performed on a semiconductor substrate such as a wafer or the like using a plurality of masks to form a semiconductor device in which an integrated circuit is implemented. The semiconductor process employed in this embodiment may be performed by a lithography process using light such as extreme ultraviolet (EUV) light, and since the mask may be manufactured using the lithography process, pitches, spaces, and/or line widths of the patterns may be freely set. In addition, the semiconductor process may include a deposition process, an etching process, an ion process, a cleaning process, or the like. In addition, the semiconductor process may include a packaging process of mounting the semiconductor device on a PCB and sealing the semiconductor device with a sealing material, or may include a test process of the semiconductor device or a package thereof.

Figure 2:
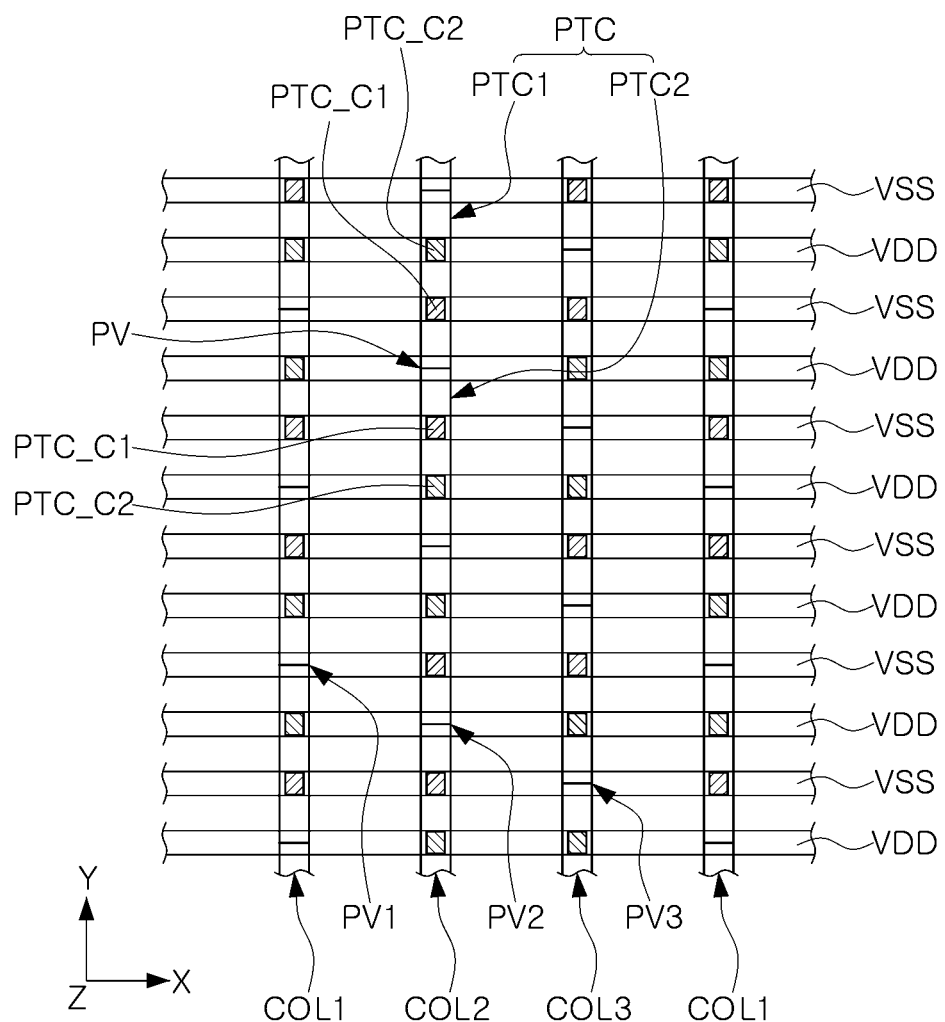
FIG. 2 is a schematic layout diagram of a semiconductor device according to an example embodiment of the present inventive concept.

FIG. 2 is a schematic layout diagram of a semiconductor device according to an example embodiment of the present inventive concept. The layout diagram illustrated in FIG. 2 may be a layout designed according to a method described with reference to FIG. 1. For convenience of description, detailed cell structures may be omitted, and a plurality of power lines VDD and VSS and power tap cells PTC may mainly be illustrated.

Referring to FIG. 2, in designing a semiconductor device, a plurality of power lines VDD and VSS and power tap cells PTC may be disposed.

The plurality of power lines VDD and VSS may be electrically connected to adjacent standard cells. Each of the plurality of power lines VDD and VSS may extend in a first horizontal direction (e.g., an X-direction). The plurality of power lines VDD and VSS may be spaced apart from each other at regular or predetermined intervals in a second horizontal direction (e.g., a Y-direction), substantially perpendicular to the first horizontal direction. The standard cells may be disposed between the plurality of power lines VDD and VSS.

The plurality of power lines VDD and VSS may include VDD power lines VDD and VSS power lines VSS, alternately arranged with each other in the second horizontal direction. Each of the standard cells may be disposed to be electrically connected to adjacent VDD power lines VDD and VSS power lines VSS.

The power tap cells PTC may be cells including taps electrically connected to the plurality of power lines VDD and VSS. Each of the power tap cells PTC may have a linear shape extending in the second horizontal direction. In an example embodiment of the present inventive concept, each of the power tap cells PTC may cross at least two power lines VDD and VSS. In an example embodiment of the present inventive concept, each of the power tap cells PTC may include a first tap PTC_C1, which is electrically connected to the VSS power lines VSS, and a second tap PTC_C2, which is electrically connected to the VDD power lines VDD. As the power tap cells PTC include at least two or more taps, a total area of the power tap cells PTC may be relatively reduced. Therefore, the number of the standard cells may be relatively increased or a degree of integration of the semiconductor device may be increased.

Adjacent power tap cells PTC may be disposed in a horizontally symmetrical manner. The horizontally symmetrical manner may mean that first and second power tap cells PTC1 and PTC2, which may be two power tap cells PTC adjacent to each other in the second horizontal direction (e.g., in the Y-direction), are arranged to be symmetrical in the second horizontal direction (e.g., in the Y-direction) with respect to a line extending in the first horizontal direction therebetween. For example, the first power tap cell PTC1 may have a shape in which the first tab PTC_C1 and the second tab PTC_C2 are sequentially disposed in the second horizontal direction (e.g., in the Y-direction), and the second power tap cell PTC2 may have a shape in which the first tab PTC_C1 and the second tab PTC_C2 may be sequentially disposed in a direction, opposing the second horizontal direction (e.g., in a −Y-direction). In this specification, the horizontally symmetrical manner may be referred to as a flipped type disposition.

As the power tap cells PTC are arranged in a horizontally symmetric manner using the first and second power tap cells PTC1 and PTC2, the total area of the power tap cells PTC may be relatively reduced. Therefore, a semiconductor device having an increased degree of integration by disposing relatively many standard cells may be provided.

The power tap cells PTC may be arranged in a plurality of columns COL1, COL2, and COL3, arranged in the first horizontal direction (e.g., in the X-direction) and spaced apart from each other in the first horizontal direction (e.g., in the X-direction). Each of the columns COL1, COL2, and COL3 may extend in the second horizontal direction (e.g., in the Y-direction). Each of the plurality of columns COL1, COL2, and COL3 may include a plurality of power tap cells PTC arranged in the second horizontal direction (e.g., in the Y-direction).

In an example embodiment of the present inventive concept, the first power tap cell PTC1 and the second power tap cell PTC2 may be disposed to contact each other. The layout of the semiconductor device according to the present example embodiment of the present inventive concept may include a power depletion region PV in which the first and second power tap cells PTC1 and PTC2 are in contact with each other. The taps PTC_C1 and PTC_C2 connected to the plurality of power lines VSS and VDD might not be disposed in the power depletion region PV. The power depletion region PV may be a region in which there is no electrical connection path with adjacent power lines VDD and VSS, among the power tap cell regions intersecting the power lines VDD and VSS.

In an embodiment of the present inventive concept, even though the first and second power tap cells PTC1 and PTC2 are not in contact with each other, the power depletion region PV, in which the taps PTC_C1 and PTC_C2 are not disposed due to sizes of the power tap cells PTC, may be formed.

Each of the plurality of columns COL1, COL2, and COL3 may include a plurality of power depletion regions PV as the power tap cells PTC are arranged in the vertically symmetrical pattern.

The plurality of columns COL1, COL2, and COL3 may include a first column COL1, a second column COL2, and a third column COL3, and the plurality of power depletion regions PV may include first power depletion regions PV1 of the first column COL1, second power depletion regions PV2 of the second column COL2, and third power depletion regions PV3 of the third column COL3.

The first to third power depletion regions PV1, PV2, and PV3 may be disposed not to overlap each other in the first horizontal direction. For example, the first to third power depletion regions PV1, PV2, and PV3 may be formed in an oblique direction between the first horizontal direction (e.g., the X-direction) and the second horizontal direction (e.g., the Y-direction). For example, the first to third power depletion regions PV1, PV2, and PV3 may be misaligned with each other in the first horizontal direction. The first to third power depletion regions PV1, PV2, and PV3 may be arranged to intersect different power lines VDD and VSS, such that the power lines VDD and VSS may have constant power performance with each other. Therefore, it is possible to provide a semiconductor device with increased electrical performance.

Figure 3A:
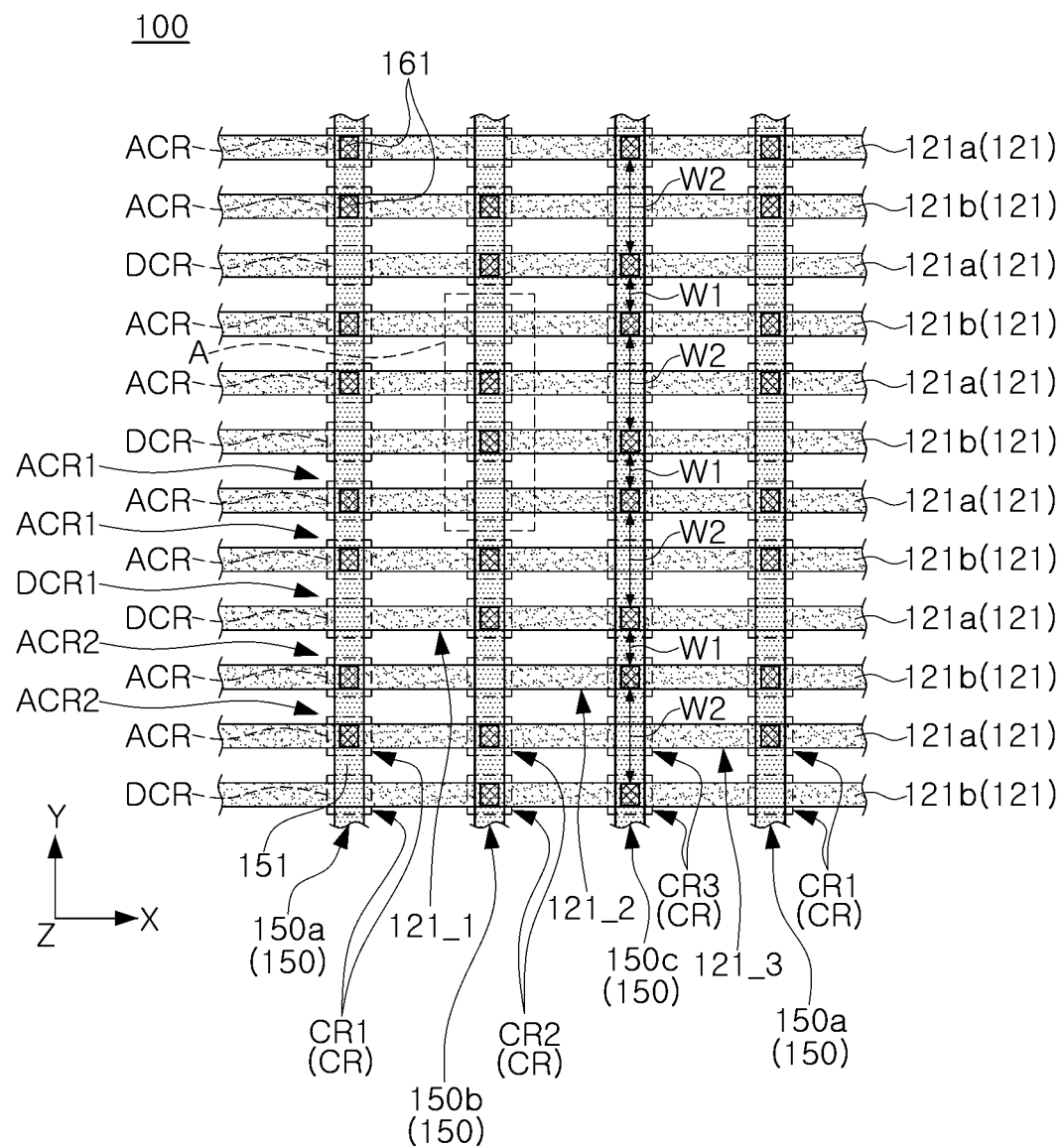
FIGS. 3A, 3B and 3C are schematic plan views of semiconductor devices according to an example embodiment of the present inventive concept.
Figure 3B:
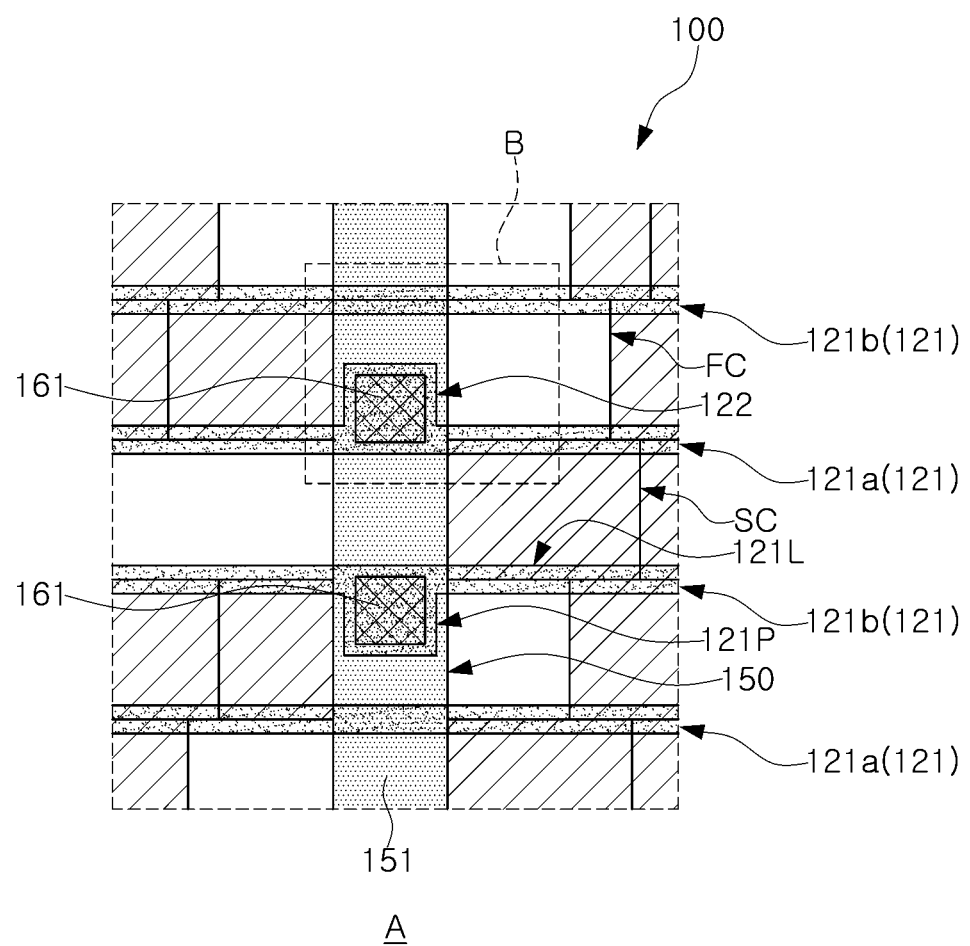
Figure 3C:
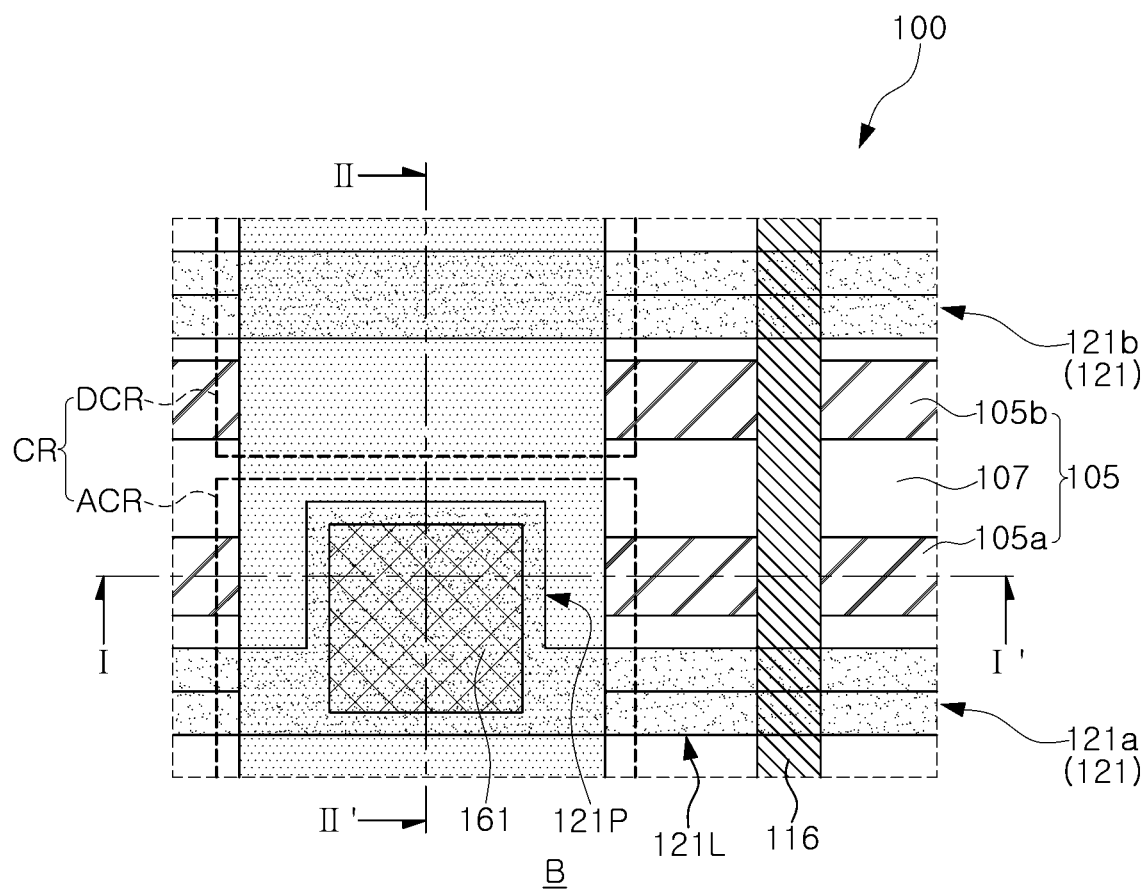
Figure 4A:
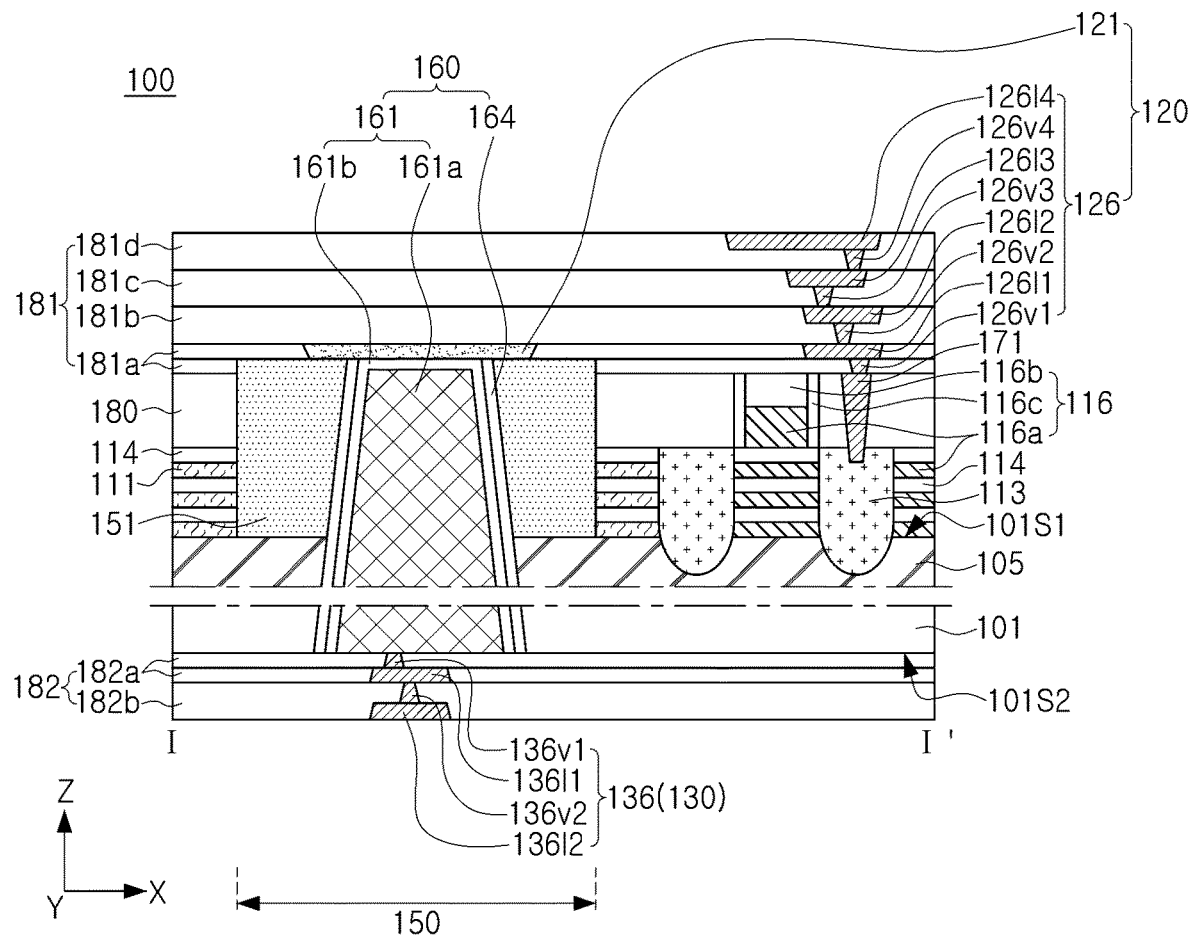
FIGS. 4A and 4B are schematic cross-sectional views of semiconductor devices according to an example embodiment of the present inventive concept.
Figure 4B:
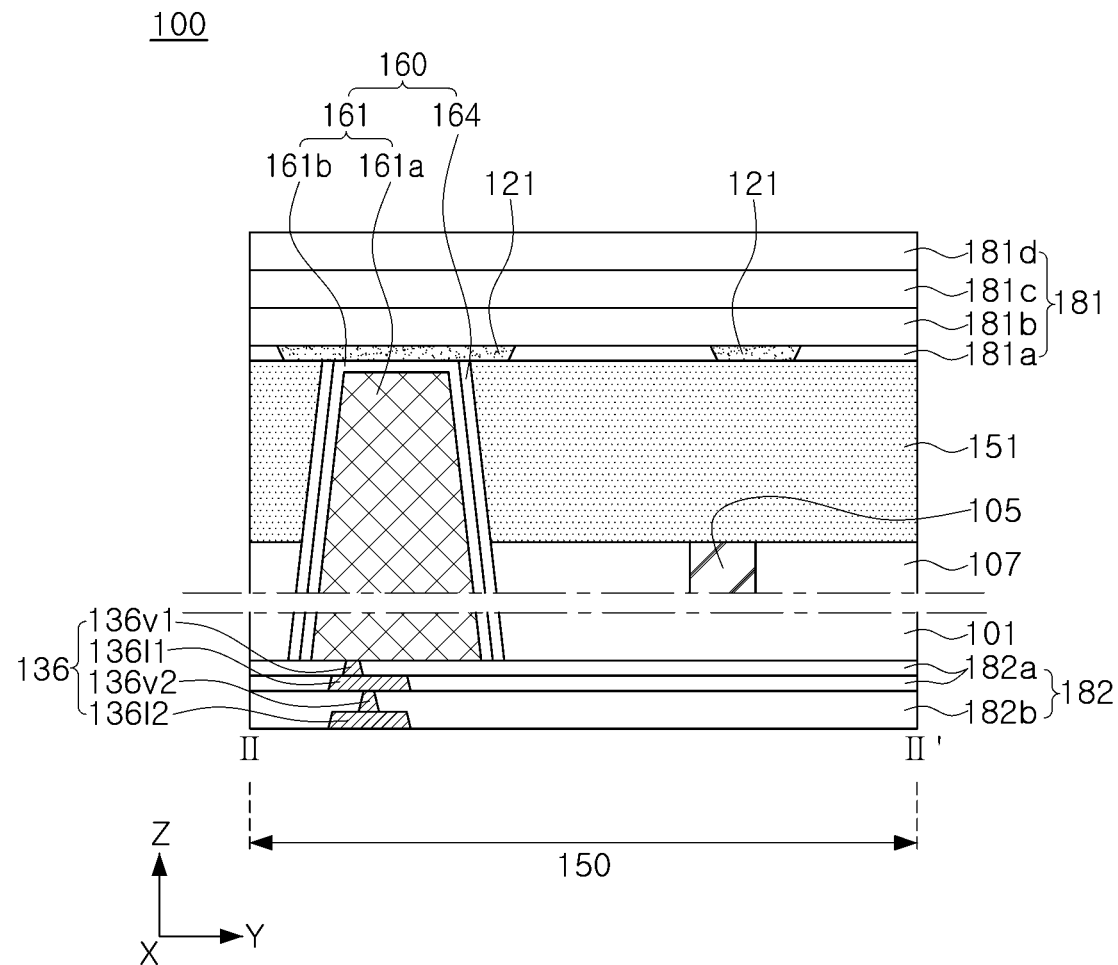

FIGS. 3A to 3C are schematic plan views of semiconductor devices 100 according to an example embodiment of the present inventive concept. FIGS. 4A and 4B are schematic cross-sectional views of semiconductor devices 100 according to an example embodiment of the present inventive concept.

FIG. 3B is a plan view illustrating an enlarged portion 'A' of FIG. 3A, and FIG. 3C is a plan view illustrating an enlarged portion 'B' of FIG. 3B.

FIG. 4A is a cross-sectional view taken along line I-I' of FIG. 3C, and FIG. 4B is a cross-sectional view taken along line II-II' of FIG. 3C.

Referring to FIGS. 3A to 4B, a semiconductor device 100 according to the present example embodiment may include a semiconductor substrate 101 having a first surface 101S1 and a second surface 101S2 opposing the first surface 101S1 and having power arrangement regions 150, active regions 105 and field regions 107, which are defined from the first surface 101S1 of the semiconductor substrate 101, circuit elements on the active regions 105, an interlayer insulating layer 180 covering the circuit elements, a front interconnection structure 120 on the circuit elements, a rear interconnection structure 130 on the second surface 101S2 of the semiconductor substrate 101, insulating structures 151 disposed on the first surface 101S1 in the power arrangement regions 150, and through-electrodes 160.

The power arrangement regions 150 and the insulating structures 151 may be structures corresponding to the power tap cells PTC of FIG. 2. In an example embodiment of the present inventive concept, the insulating structures 151 may overlap the power arrangement regions 150 in a vertical direction (e.g., in a Z-direction). For example, the insulating structures 151 may completely overlap the power arrangement regions 150 in a vertical direction.

Referring to FIG. 3A, power lines 121 of the front interconnection structure 120 may be parallel to each other, and may extend in the first horizontal direction (e.g., in the X-direction). The power lines 121 may be disposed to be spaced apart from each other in the second horizontal direction (e.g., in the Y-direction). The power lines 121 may include VSS power lines 121a and VDD power lines 121b, alternately spaced apart from each other in the second horizontal direction. The VSS power lines 121a may be the VSS power lines VSS of FIG. 2, and the VDD power lines 121b may be the VDD power lines VDD of FIG. 2.

The power arrangement regions 150 may be parallel to each other, and may each extend in the second horizontal direction (e.g., in the Y-direction). According to an example embodiment of the present inventive concept, the power arrangement regions 150 may have a linear shape intermittently extending in the second horizontal direction (e.g., in the Y-direction).

In an example embodiment of the present inventive concept, the insulating structures 151 disposed on the power arrangement regions 150 may also have the same or similar linear shape.

The power arrangement regions 150 may be disposed to be spaced apart from each other in the first horizontal direction (e.g., the X-direction). The power arrangement regions 150 may include first to third power arrangement regions 150a, 150b, and 150c, spaced apart from each other at regular or predetermined intervals in the first horizontal direction (e.g., the X-direction). In a plan view, the power arrangement regions 150 may refer to regions corresponding to the power tap cells PTC of FIG. 2.

The through-electrodes 160 may pass through the power arrangement regions 150 to contact the power lines 121. The through-electrodes 160 may include the first tab PTC_C1 and the second tab PTC_C2 of FIG. 2.

In a plan view, a semiconductor device 100 according to the present example embodiment may include intersection regions CR in which the power arrangement regions 150 and the power lines 121 intersect each other. The intersection regions CR may include active intersection regions ACR and dummy intersection regions DCR. In a plan view, the through-electrodes 160 may be disposed in the active intersection regions ACR, and might not be disposed in the dummy intersection regions DCR. For example, the active intersection regions ACR may overlap the through-electrodes 160 in the vertical direction (e.g., in the Z-direction), and the dummy intersection regions DCR might not overlap the through-electrodes 160 in the vertical direction (e.g., in the Z-direction).

The active intersection regions ACR may be regions in which rear interconnection patterns 136 of the rear interconnection structure 130 and the power lines 121 are electrically connected to each other by the through-electrodes 160.

The dummy intersection regions DCR may be regions in which the through-electrodes 160 are not disposed, and may correspond to the power depletion region PV of FIG. 2.

The intersection regions CR may include a plurality of active intersection regions ACR and at least one dummy intersection region DCR, alternately and repeatedly arranged in the second horizontal direction (e.g., in the Y-direction). This may be an arrangement formed by disposing the power tap cells PTC in a horizontally symmetrical manner in a design stage for manufacturing a semiconductor device, as described with reference to FIG. 2. As the plurality of active intersection regions ACR and the one dummy intersection region DCR are alternately and repeatedly arranged, an area defined by the power arrangement regions 150 on a plane may be relatively reduced. Therefore, a semiconductor device having a high degree of integration may be provided by arranging the circuit elements in an additionally secured region.

In an example embodiment of the present inventive concept, the intersection regions CR may include a plurality of first active intersection regions ACR1, one first dummy intersection region DCR1, and a plurality of second active intersection regions ACR2, sequentially arranged in the second horizontal direction (e.g., in the Y-direction). For example, the plurality of first active intersection regions ACR1 may be a pair of intersection regions adjacent to each other in the second horizontal direction (e.g., in the Y-direction), and the plurality of second active intersection regions ACR2 may be a pair of intersection regions adjacent to each other in the second horizontal direction (e.g., in the Y-direction).

Among the through-electrodes 160 sequentially arranged in the second horizontal direction, a pair of through-electrodes spaced apart from each other by a first interval W1 may be repeatedly arranged at a second interval W2, greater than the first interval W1. Among the through-electrodes 160, through-electrodes 160 spaced apart by the first interval W1 may be in contact with the power lines 121 adjacent to each other, respectively, and through-electrodes 160 spaced apart at the second interval W2 may be in contact with power lines 121 spaced apart from each other by second interval W2 with one power line 121 interposed between the power lines 121 spaced apart from each other by the second interval W2. This may be because a semiconductor device 100 according to the present example embodiment has active intersection regions ACR and dummy intersection regions DCR as the power tap cells are arranged in the horizontally symmetrical manner.

In an example embodiment of the present inventive concept, the power arrangement regions 150 may include a first power arrangement region 150a and a second power arrangement region 150b adjacent to each other. The intersection regions CR may include first intersection regions CR1 in which the first power arrangement region 150a and the power lines 121 intersect each other, and second intersection regions CR2 in which the second power arrangement region 150b and the power lines 121 intersect each other.

The first intersection regions CR1 may include first active intersection regions, in which the through-electrodes 160 are disposed, and a first dummy intersection region DCR in which the through-electrodes 160 are not disposed, and the second intersection regions CR2 may include second active intersection regions, in which the through-electrodes 160 are disposed, and a second dummy intersection region DCR in which the through-electrodes 160 are not disposed. The first dummy intersection region DCR and the second dummy intersection region DCR may be arranged in an oblique direction extending between the first horizontal direction (e.g., the X-direction) and the second horizontal direction (e.g., the Y-direction).

When a pair of active intersection regions ACR and one dummy intersection region DCR in the intersection regions CR are alternately and repeatedly arranged in the second horizontal direction (e.g., in the Y-direction), the power arrangement regions 150 may include first to third power arrangement regions 150a, 150b, and 150c, sequentially arranged in the first horizontal direction (e.g., in the X-direction). The first to third power arrangement regions 150a, 150b, and 150c may be spaced apart from each other at regular or predetermined intervals. The intersection regions CR may include first intersection regions CR1, in which the first power arrangement region 150a and the power lines 121 intersect each other, second intersection regions CR2, in which the second power arrangement region 150b and the power lines 121 intersect each other, and third intersection regions CR3, in which the third power arrangement region 150c and the power lines 121 intersect each other.

The first intersection regions CR1 may include first active intersection regions ACR, in which the through-electrodes 160 are disposed, and a first dummy intersection region DCR, in which the through-electrodes 160 are not disposed. The second intersection regions CR2 may include second active intersection regions ACR, in which the through-electrodes 160 are disposed, and a second dummy intersection region DCR, in which the through-electrodes 160 are not disposed, and the third intersection regions CR3 may include third active intersection regions ACR, in which the through-electrodes 160 are disposed, and third dummy intersection regions DCR, in which through-electrodes 160 are not disposed. The first to third dummy intersection regions DCR might not overlap each other in the first horizontal direction (e.g., in the X-direction). As the number of dummy intersection regions DCR in which the through-electrodes 160 are not disposed may be the same for each power line 121, the power lines 121 may have a substantially uniform power performance. Therefore, a semiconductor device having increased electrical performance may be provided.

In an example embodiment of the present inventive concept, the power lines 121 may include first to third power lines 121_1, 121_2, and 121_3, sequentially arranged in the second horizontal direction (e.g., in the Y-direction). The number of through-electrodes 160 of the first to third power arrangement regions 150a, 150b, and 150c contacting each of the first to third power lines 121_1, 121_2, and 1213 may be the same as one another. For example, the number of through-electrodes 160 of the first power arrangement region 150a contacting the first to third power lines 121_1, 121_2, and 121_3 is the same as the number of through-electrodes 160 of the second power arrangement region 150b contacting the first to third power lines 121_1, 121_2, and 121_3.

The intersection regions CR may include first, second, and third dummy intersection regions DCR, arranged in an oblique direction extending between the first horizontal direction (e.g., the X-direction) and the second horizontal direction (e.g., the Y-direction). The first dummy intersection region DCR may be an intersection region CR between the first power arrangement region 150a and the first power line 121_1. The second dummy intersection region DCR may be an intersection region CR between the second power arrangement region 150b and the second power lines 121_2, and the third dummy intersection region DCR may be an intersection region CR between the third power arrangement region 150c and the third power line 121_3.

The first power line 121_1 may be electrically connected to through-electrodes 160 passing through the second and third power arrangement regions 150b and 150c. The second power line 1212 may be electrically connected to through-electrodes 160 passing through the first and third power arrangement regions 150a and 150c, and the third power line 121_3 may be electrically connected to through-electrodes 160 passing through the first and second power arrangement regions 150a and 150b.

Intersecting regions CR between the first power line 121_1 and the first to third power arrangement regions 150a, 150b, and 150c may be sequentially arranged with a dummy intersection region DCR, an active intersection region ACR, and an active intersection region ACR in the first horizontal direction (e.g., in the X-direction).

Intersecting regions CR between the second power line 121_2 and the first to third power arrangement regions 150a, 150b, and 150c may be sequentially arranged with an active intersection region ACR, a dummy intersection region DCR, and an active intersection region ACR in the first horizontal direction (e.g., in the X-direction).

Intersecting regions CR between the third power line 121_3 and the first to third power arrangement regions 150a, 150b, and 150c may be sequentially arranged with an active intersection region ACR, an active intersection region ACR, and a dummy intersection region DCR in the first horizontal direction (e.g., in the X-direction).

Referring to FIG. 3B, a semiconductor device 100 according to the present example embodiment may include standard cells SC and filler cells FC, which serve as dummy regions. The standard cells SC may each extend in rows in the first horizontal direction (e.g., in the X-direction), and may be respectively arranged in a plurality of rows in the second horizontal direction, substantially perpendicular to the first horizontal direction. The filler cells FC may be disposed between the standard cells SC to provide a dummy region.

Each of the standard cells SC arranged in each of the rows may have a constant cell height defined in the second horizontal direction. Standard cells SC located in the same row have the same cell height, but standard cells SC located in some rows may have different cell heights from the standard cells SC located in another row. The standard cells SC may have different widths in the first horizontal direction (e.g., in the X-direction), even when they are located in the same row.

As used herein, the term "height" (e.g., "cell height") used in relation to a standard cell may mean a length or a distance in the second horizontal direction (e.g., in the Y-direction), when viewed in a plan view.

The power arrangement regions 150 may have a linear shape extending in the second horizontal direction between the standard cells SC and the filler cells FC. The insulating structures 151 on the power arrangement regions 150 may have a linear shape, which is identical or similar to that of the power arrangement regions 150. The power arrangement regions 150 and/or the insulating structures 151 may be in contact with adjacent standard cells SC or filler cells FC.

The first and second power lines 121a and 121b supplying power to the standard cells SC may extend in the first horizontal direction (the X-direction) along boundaries of the standard cells SC, respectively. The first and second power lines 121a and 121b may be arranged to be spaced apart from each other in the second horizontal direction (the Y-direction). Each of the first and second power lines 121a and 121b may supply different potentials to the standard cells SC located between the first and second power lines 121a and 121b. Among the first and second power lines 121a and 121b, a power line disposed at a boundary between the standard cells SC of two adjacent rows may be a power line shared by the adjacent standard cells SC. At least one of the first and second power lines 121a and 121b may be arranged to cross at least one of the standard cells SC and the filler cells FC.

In an example embodiment of the present inventive concept, each of the power lines 121 may include a line portion 121L and landing pad portions 121P. The landing pad portions 121P may have plan areas, larger than a plan area of the through-electrodes 160. Each of the landing pad portions 121P may have a width greater than a width of the line portion 121L in the second horizontal direction (e.g., the Y-direction). In the first horizontal direction (e.g., in the X-direction), the landing pad portions 121P may be aligned to be offset from a center of the line portion 121L in the second horizontal direction (e.g., in the Y-direction) or in the opposite direction (e.g., in the −Y-direction). For example, the landing pad portions 121P may extend or protrude from the line portion 121L. According to an example embodiment of the present inventive concept, the landing pad portions 121P may be aligned with the line portion 121L in the first horizontal direction (e.g., in the X-direction).

Each of the standard cells SC may have a P-type device region and an N-type device region, arranged in the second horizontal direction (e.g., in the Y-direction). Referring to FIG. 3C together, the P-type device region may be a region including a first active region 105a, and the N-type device region may be a region including a second active region 105b. The P-type device region may be a region in which PMOS transistors are disposed, and the N-type device region may be a region in which NMOS transistors are disposed. Although heights of the active regions 105a and 150b are illustrated as being the same, heights of the active regions 105 may be adjusted differently for each standard cell SC according to an example embodiment of the present inventive concept.

FIGS. 3C to 4B illustrate only some components to explain an arrangement of the power lines 121, the power arrangement regions 150, and other components adjacent to the through-electrodes 160 in a semiconductor device 100 according to an example embodiment of the present inventive concept.

The semiconductor substrate 101 may have an upper surface extending in the first horizontal direction (e.g., in the X-direction) and the second horizontal direction (e.g., in the Y-direction). The semiconductor substrate 101 may include a semiconductor material, for example, a group IV semiconductor, a group III-V compound semiconductor, or a group II-VI compound semiconductor. For example, the group IV semiconductor may include silicon, germanium, or silicon-germanium. The semiconductor substrate 101 may be provided as a bulk wafer, an epitaxial layer, a silicon-on-insulator (SOI) layer, a semiconductor-on-insulator (SeOI) layer, or the like.

The field regions 107 may define the active regions 105 in the semiconductor substrate 101. The field regions 107 may be formed by, for example, a shallow trench isolation (STI) process. The field regions 107 may include, but might not be limited to, a region extending deeper into a lower portion of the semiconductor substrate 101 between adjacent active regions 105. For example, the field regions 107 may have upper portions having a level lower than upper portions of the active regions 105. Therefore, the field regions 107 may partially expose the upper portions of the active regions 105. In an example embodiment, the field regions 107 may be filled with an insulating material, and may include, for example, an oxide, a nitride, or a combination thereof. However, the present inventive concept is not limited thereto. For example, the upper portions of the field regions 107 may be at the same level as the upper portions of the active regions 105.

The active regions 105 may extend parallel to each other in the first horizontal direction (e.g., in the X-direction) on the semiconductor substrate 101. The active regions 105 may be defined by the field regions 107. The active regions 105 may be disposed to protrude from an upper surface of the field regions 107 to a predetermined height. The active regions 105 may be formed as a portion of the semiconductor substrate 101, and may include an epitaxial layer grown from the semiconductor substrate 101 in some example embodiments of the present inventive concept. In this specification, since the active regions 105 may be formed as a portion of the semiconductor substrate 101, it may be described that upper surfaces of the active regions 105 form a portion of the first surface 101S1 of the semiconductor substrate 101. The active regions 105 may be partially recessed on both sides of gate structures 116, and source/drain regions 113 may be disposed on the recessed active regions 105.

The active regions 105 may have doped regions including impurities. For example, the active regions 105 may include impurities, which are diffused from the source/drain regions 113, in a region contacting the source/drain regions 113.

The active regions 105 may include a first active region 105a and a second active region 105b, extending parallel to each other. In an example embodiment of the present inventive concept, each of the standard cells SC (see FIG. 3B) may include the first and second active regions 105a and 105b. The first active region 105a and the second active region 105b may be active regions of different conductivity types from each other. For example, the first active region 105a may be a region having an n-well.

The circuit elements may be disposed on the first surface 101S1 of the semiconductor substrate 101. Each of the circuit elements may include channel layers 114 disposed on the active regions 105, source/drain regions 113 contacting the channel layers 114, and gate structures 116 intersecting the active regions 105 and the channel layers 114.

In an example embodiment of the present inventive concept, the circuit elements may be transistors including a gate electrode 116a. In the transistors, the active regions 105 have a fin structure, and the gate electrode 116a may be disposed between the active regions 105 and the channel layers 114, between each of the channel layers 114, and on the channel layers 114. Therefore, the transistor may be a transistor of a multibridge channel FET (MBCFET™) structure, which may be a gate-all-around (GAA) type field effect transistor by the channel layers 114, the source/drain regions 113, and the gate structures 116.

In the transistor, the active regions 105 have a fin structure, a channel layer having a fin structure may be disposed on the active regions 105, and the gate electrode 116a may cover an upper surface and a side surface of the channel layer, unlike the above description, according to an example embodiment of the present inventive concept. Therefore, the transistor may be a fin-type field effect transistor formed by the channel layer, the source/drain regions, and the gate structures.

The channel layers 114 may be stacked on the active regions 105 while being spaced apart from each other in the vertical direction (e.g., in the Z-direction), substantially perpendicular to the semiconductor substrate 101. The channel layers 114 may be spaced apart from the upper surfaces of the active regions 105 while being connected to the source/drain regions 113. The channel layers 114 may have widths, identical or similar to widths of the active regions 105 in the Y-direction, and may have widths, identical or similar to widths of the gate structures 116 in the X-direction. Although three (3) channel layers 114 are illustrated, the number of channel layers is not limited thereto, and may be variously changed. For example, in some example embodiments of the present inventive concept, the channel layers 114 may further include a channel layer disposed on the upper surfaces of the active regions 105. The channel layers 114 may be formed of a semiconductor material, and may include, for example, at least one of silicon (Si), silicon germanium (SiGe), and/or germanium (Ge). Each of the channel layers 114 may include the same material, but may include different materials from each other according to an example embodiment of the present inventive concept.

In an example embodiment of the present inventive concept, a portion of the channel layers 114 may be alternately stacked with first semiconductor layers 111, or may be a dummy channel region in which the gate structures 116 do not intersect.

The source/drain regions 113 may be disposed on the active regions 105 and on at least one side of the channel layers 114. The source/drain regions 113 may be disposed to cover a side surface of each of the channel layers 114 and the upper surfaces of the active regions 105.

On both sides of the gate structures 116, the source/drain regions 113 may be disposed in recessed regions of the active regions 105. The source/drain regions 113 may be in contact with the channel layers 114. The source/drain regions 113 may have upper surfaces having a higher level, than the upper surfaces of the active regions 105 by performing selective epitaxial growth (SEG) in the recessed regions. The source/drain regions 113 may serve as a source region or a drain region of transistors.

The source/drain regions 113 may have a merged shape connected to each other between adjacent active regions 105 in the second horizontal direction (e.g., in the Y-direction), but the present inventive concept is not limited thereto. The source/drain regions 113 may have angled side surfaces in the second horizontal direction (the Y-direction). In an example embodiment of the present inventive concept, the source/drain regions 113 may have various shapes, for example, any one of a polygonal shape, a circular shape, an elliptical shape, and/or a rectangular shape.

The source/drain regions 113 may be formed of an epitaxial layer, and may include, for example, silicon (Si), silicon germanium (SiGe), or silicon carbide (SiC). In addition, the source/drain regions 113 may further include impurities such as arsenic (As) and/or phosphorus (P). In some example embodiments of the present inventive concept, the source/drain regions 113 may include a plurality of regions including an element and/or a doping element having different concentrations.

Each of the gate structures 116 may intersect the active regions 105, and may extend in the second horizontal direction (e.g., the Y-direction). A channel region of the transistors may be formed on a region in which the gate structures 116 and the active regions 105 intersect. For example, the gate structure 116 may overlap portions of the active regions 105 that correspond to the channel region.

Each of the gate structures 116 may include a gate electrode 116a, a gate capping layer 116b, and a gate spacer layer 116c. Between the channel layers 114, upper and lower surfaces of each of the gate structures 116 may be in contact with the channel layers 114.

The gate electrode 116a may be disposed on the active regions 105 to fill a space between the channel layers 114, and to extend over the channel layers 114. The gate electrode 116a may include a conductive material, and may include, for example, a metal nitride such as titanium nitride (TiN), tantalum nitride (TaN), or tungsten nitride (WN), and/or a metal material such as aluminum (Al), tungsten (W), molybdenum (Mo), or the like, or a semiconductor material such as doped polysilicon. The gate electrode 116a may be formed of two or more multi-layers. The gate electrode 116a may be disposed to be separated from each other in the second horizontal direction (e.g., the Y-direction) between at least some of adjacent transistors, according to the circuit configuration of the semiconductor device 100. For example, the gate electrode 116a may be separated by a separate gate isolation layer.

In an example embodiment of the present inventive concept, the gate structures 116 may further include a gate dielectric layer disposed between the gate electrode 116a and the channel layers 114. The gate dielectric layer may be disposed between each of the active regions 105 and the gate electrode 116a and between the channel layers 114 and the gate electrode 116a, and may be disposed to cover at least a portion of surfaces of the gate electrode 116a. For example, the gate dielectric layer may be disposed to surround all surfaces except for the upper surface of the gate electrode 116a. The gate electrode 116a may be spaced apart from the channel layers 114 by the gate dielectric layer. The gate dielectric layer may include a plurality of layers or may be a single layer. The gate dielectric layer may include, for example, an oxide, a nitride, or a high-K material. The high-K material may refer to a dielectric material having a higher dielectric constant than that of a silicon oxide layer ($SiO_2$).

The gate capping layer 116b may be disposed on the gate electrode 116a, and a lower surface and side surfaces of the gate capping layer 116b may be at least partially surrounded by the gate electrode 116a and the gate spacer layers 116c, respectively. For example, the gate capping layer 116b may include an oxide, a nitride, or an oxynitride.

The gate spacer layers 116c may be disposed on both side surfaces of the gate electrode 116a, and may extend in the vertical direction (e.g., the Z-direction), substantially perpendicular to the upper surface of the semiconductor substrate 101. The gate spacer layers 116c may insulate the source/drain regions 113 from the gate electrode 116a. In some example embodiments of the present inventive concept, the gate spacer layers 116c may formed as a multilayer structure. The gate spacer layers 116c may include, for example, an oxide, a nitride, or an oxynitride, and for example, may include a low dielectric material. For example, the gate spacer layers 116c may include at least one of SiO, SiN, SiCN, SiOC, SiON, or SiOCN.

The interlayer insulating layer 180 may be disposed to cover the source/drain regions 113 and the gate structures 116 on the first surface 101S1 of the semiconductor substrate 101, and may be disposed to cover the field regions 107. The interlayer insulating layer 180 may include, for example, at least one of an oxide, a nitride, or an oxynitride, and may include a low dielectric material.

In an example embodiment of the present inventive concept, the semiconductor device 100 may further include upper insulating layers 181 that are disposed on the interlayer insulating layer 180. The upper insulating layers 181 may include first to fourth upper insulating layers 181a, 181b, 181c, and 181d, sequentially stacked on each other.

The front interconnection structure 120 may be an interconnection structure disposed on the first surface 101S1 of the semiconductor substrate 101.

The front interconnection structure 120 may include power lines 121 and front interconnection patterns 126.

The front interconnection patterns 126 may include a plurality of front interconnection lines 126/1, 126/2, 126/3, and 126/4 disposed on different levels from each other, and a plurality of front interconnection vias 126v1, 126v2, 126v3, and 126v4 electrically connecting the plurality of front interconnection lines 126/1, 126/2, 126/3, and 126/4 to each other. The plurality of front interconnection vias 126v1, 126v2, 126v3, and 126v4 may have inclined side surfaces decreasing in width in a direction toward the semiconductor substrate 101, but the present inventive concept is not limited thereto.

In an example embodiment of the present inventive concept, the front interconnection patterns 126 may include first front interconnection patterns 126/1 and 126v1, second front interconnection patterns 126/2 and 126v2, third front interconnection patterns 126/3 and 126v3, and fourth front interconnection patterns 126/4 and 126v4, sequentially stacked on each other. Although the number of front interconnection patterns is illustrated as four (4) in the present embodiment, the number of front interconnection patterns may be variously changed according to an example embodiment of the present inventive concept.

The first front interconnection patterns 126/1 and 126v1 may pass through the first upper insulating layer 181a. The second front interconnection patterns 126/2 and 126v2 may pass through the second upper insulating layer 181b. The third front interconnection patterns 126/3 and 126v3 may pass through the third upper insulating layer 181c, and the fourth front interconnection patterns 126/4 and 126v4 may pass through the fourth upper insulating layer 181d.

The first front interconnection patterns 126/1 and 126v1 may include a first front interconnection line 126/1 and a first front interconnection via 126v1. The second front interconnection patterns 126/2 and 126v2 may include a second front interconnection lines 126/2 and a second front interconnection via 126v2. The third front interconnection patterns 126/3 and 126v3 may include a third front interconnection line 126/3 and a third front interconnection via 126v3, and the fourth front interconnection patterns 126/4 and 126v4 may include a fourth front interconnection line 126/4 and a fourth front interconnection via 126v4. The first front interconnection line 126/1 may be disposed on a level higher than that of the gate electrode 116a, and may be closest to the first surface 10 S1 of the semiconductor substrate 101 among the front interconnection lines 126/1, 126/2, 126/3, and 126/4.

Each front interconnection pattern may be either a 'single damascene structure' in which interconnection vias and interconnection lines each separately pass through an insulating layer and fill it with a conductive material, or a 'dual damascene structure' in which interconnection lines and interconnection vias are integrally formed.

The first front interconnection line 126/1 may be disposed on a level higher than that of the circuit elements.

The power lines 121 may be parallel to each other and may each extend in the first horizontal direction (e.g., in the X-direction). In an example embodiment of the present inventive concept, the power lines 121 may be disposed on the same height level as the first front interconnection line 126/1. Referring to FIGS. 3A and 3B together, each of the power lines 121 may include a line portion 121L and landing pad portions 121P contacting the through-electrodes 160. A planar area of each of the landing pad portions 121P may be greater than a planar area of the through-electrodes 160. The landing pad portions 121P may serve as an etch stop layer in a process of forming the through-electrodes 160, but the present inventive concept is not limited thereto, and may include a separate etch stop layer. The line portion 121L and the landing pad portions 121P may be connected to each other and may be in contact with each other. In the second horizontal direction (the Y-direction), a width of each of the landing pad portions 121P may be greater than a width of the line portion 121L. This may be because a width of each of the through-electrodes 160 may be greater than a width of the line portion 121L of each of the power lines 121.

In an example embodiment of the present inventive concept, the semiconductor device 100 may further include a contact plug 171 passing through the interlayer insulating layer 180 to be connected to the source/drain regions 113. The contact plug 171 may apply an electrical signal to the source/drain regions 113 from the front interconnection patterns 126. The contact plug 171 may be disposed on the source/drain regions 113. The contact plug 171 may have an inclined side surface decreasing in width in a direction toward the semiconductor substrate 101 according to an aspect ratio. The contact plug 171 may be recessed from the source drain regions 113 by a predetermined depth, but the present inventive concept is not limited thereto.

In an example embodiment of the present inventive concept, the semiconductor device 100 may include lower insulating layers 182 on the second surface 101S2 of the semiconductor substrate 101. The lower insulating layers 182 may include first and second lower insulating layers 182a and 182b, sequentially stacked on the second surface 101S2 of the semiconductor substrate 101.

The rear interconnection structure 130 may include rear interconnection patterns 136 passing through the lower insulating layers 182. The rear interconnection patterns 136 may correspond to a power distribution network (PDN) described with reference to FIG. 1.

The rear interconnection patterns 136 may include a plurality of rear interconnection lines 136/1 and 136/2 disposed on different levels from each other, and a plurality of rear interconnection vias 136v1 and 136v2 electrically connecting the plurality of rear interconnection lines 136/1 and 136/2 to each other. The plurality of rear interconnection vias 136v1 and 136v2 may have inclined side surfaces decreasing in width in a direction toward the semiconductor substrate 101, but the present inventive concept is not limited thereto.

In an example embodiment of the present inventive concept, the rear interconnection patterns 136 may include first rear interconnection patterns 136/1 and 136v1 and second rear interconnection patterns 136/2 and 136v2, sequentially stacked on the second surface 101S2 of the semiconductor substrate 101. Although the number of rear interconnection patterns is illustrated as two (2) in the present embodiment, the number of rear interconnection patterns may be variously changed according to an example embodiment of the present inventive concept.

The first rear interconnection patterns 136/1 and 136v1 may pass through the first lower insulating layer 182a, and the second rear interconnection patterns 136/2 and 136v2 may pass through the second lower insulating layer 182b.

The first rear interconnection patterns 136/1 and 136v1 may include a first rear interconnection line 136/1 and a first rear interconnection via 136v1, and the second rear interconnection patterns 136/2 and 136v2 may include a second rear interconnection line 136/2 and a second rear interconnection via 136v2.

Each rear interconnection pattern may be either a 'single damascene structure' in which interconnection vias and interconnection lines each separately pass through an insulating layer and fill it with a conductive material, or a 'dual damascene structure' in which interconnection lines and interconnection vias are integrally formed.

The first rear interconnection line 136/1 may be disposed on a lower level than the circuit elements.

Among the rear interconnection patterns 136, the first rear interconnection pattern 136/1 and 136v1, which may be a rear interconnection pattern closest to the second surface 101S2 of the semiconductor substrate 101, may be in contact with the through-electrodes 160. At least some of the rear interconnection patterns 136 may supply power to the power lines 121 through the through-electrodes 160.

The insulating structures 151 may be disposed on the first surface of the power arrangement regions 150, and may overlap the power arrangement regions 150 in the Z-direction. For example, an entirety of each of the insulating structures 151 may overlap each of the power arrangement regions 150. Upper surfaces of the insulating structures 151 may be in contact with the first upper insulating layer 181a. The insulating structures 151 may be in contact with first semiconductor layers 111, channel layers 114, and an interlayer insulating layer 180, adjacent to the insulating structures 151. A width of each of the insulating structures 151 in the first horizontal direction (e.g., in the X-direction) may be greater than a width or a diameter of each of the through-electrodes 160. In an example embodiment of the present inventive concept, the insulating structures 151 may include an insulating material, for example, an oxide, a nitride, a carbide, or a combination thereof. In some example embodiments of the present inventive concept, a boundary between the insulating structures 151 and the interlayer insulating layer 180 might not be distinguished.

The through-electrodes 160 may pass through the power arrangement regions 150 and the insulating structures 151, to contact the power lines 121. The through-electrodes 160 may pass through at least the semiconductor substrate 101 between the first surface 101S1 and the second surface 101 S2. The through-electrodes 160 may have a width decreasing from the second surface 101S2 to the first surface 101S1 of the semiconductor substrate 101; however, the present inventive concept is not limited thereto. According to an example embodiment of the present inventive concept, the through-electrodes 160 may have different shapes from each other. The through-electrodes 160 may be, for example, through-silicon vias (TSV).

Each of the through-electrodes 160 may include a through-pattern 161 and a through-spacer 164 surrounding a side surface of the through-pattern 161. The through-spacer 164 may separate the through-pattern 161 from the semiconductor substrate 101. For example, the through-spacer 164 may be disposed between the semiconductor substrate 101 and the through-pattern 161.

The through-pattern 161 may include a plug layer 161a and a barrier layer 161b covering a side surface and an upper surface of the plug layer 161a. The barrier layer 161b may overlap the power lines 121. For example, the barrier layer 161b may be in contact with the power lines 121. The plug layer 161a may include, for example, a metal nitride such as a titanium nitride film (TiN), a tantalum nitride film (TaN), or a tungsten nitride film (WN), and/or a metal material such as aluminum (Al), tungsten (W), molybdenum (Mo), or the like. The barrier layer 161b may include, for example, a metal nitride such as a titanium nitride film (TiN), a tantalum nitride film (TaN), or a tungsten nitride film (WN).

Figure 5:
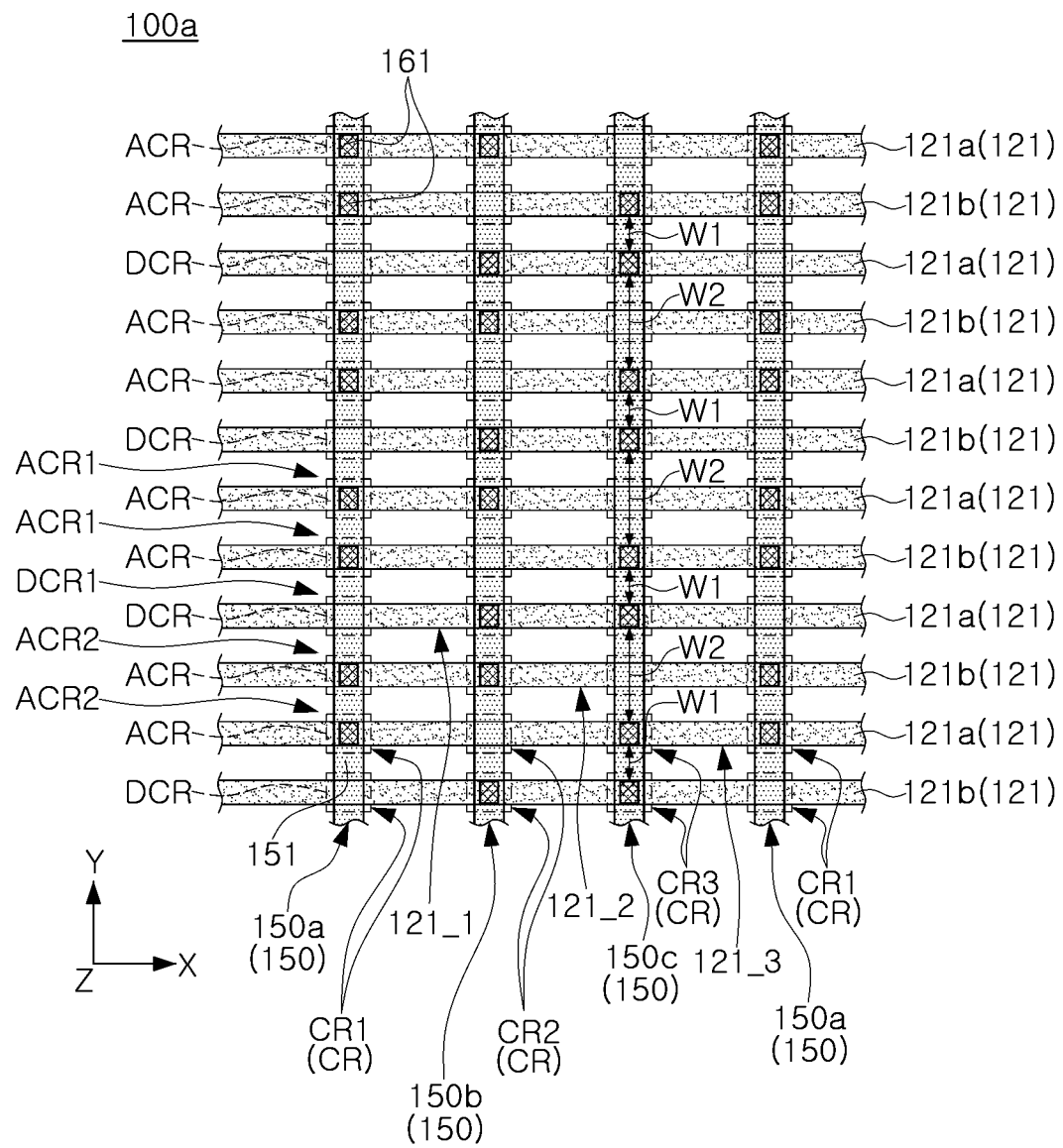
FIG. 5 is a schematic plan view of a semiconductor device according to an example embodiment of the present inventive concept.

FIG. 5 is a schematic plan view of a semiconductor device 100a according to an example embodiment of the present inventive concept. A semiconductor device 100a of FIG. 5 may have the same characteristics and structure as those described in the semiconductor device 100 of FIGS. 3A to 4B, except for an arrangement of intersection regions CR. Therefore, the overlapping description will be omitted.

Referring to FIG. 5, intersection regions CR may include active intersection regions ACR and dummy intersection regions DCR. In a semiconductor device 100a of FIG. 5, the dummy intersection regions DCR may be arranged in a direction, different from the dummy intersection regions of the semiconductor device of FIG. 3A. For example, the dummy intersection regions DCR may be arranged in an oblique direction, symmetrical to an oblique direction in which the dummy intersection regions of the semiconductor device of FIG. 3A are arranged, in the intersection regions CR1, CR2, and CR3 spaced apart from each other in the first direction (e.g., in the X-direction).

In the semiconductor device 100a according to the present example embodiment, power tap cells PTC may be arranged in a horizontal symmetry manner in the design stage for manufacturing the semiconductor device, as described with reference to FIG. 2, but the dummy intersection regions DCR may be arranged in different directions, as illustrated in FIG. 5, to provide a semiconductor device having increased integration and electrical performance.

Figure 6:
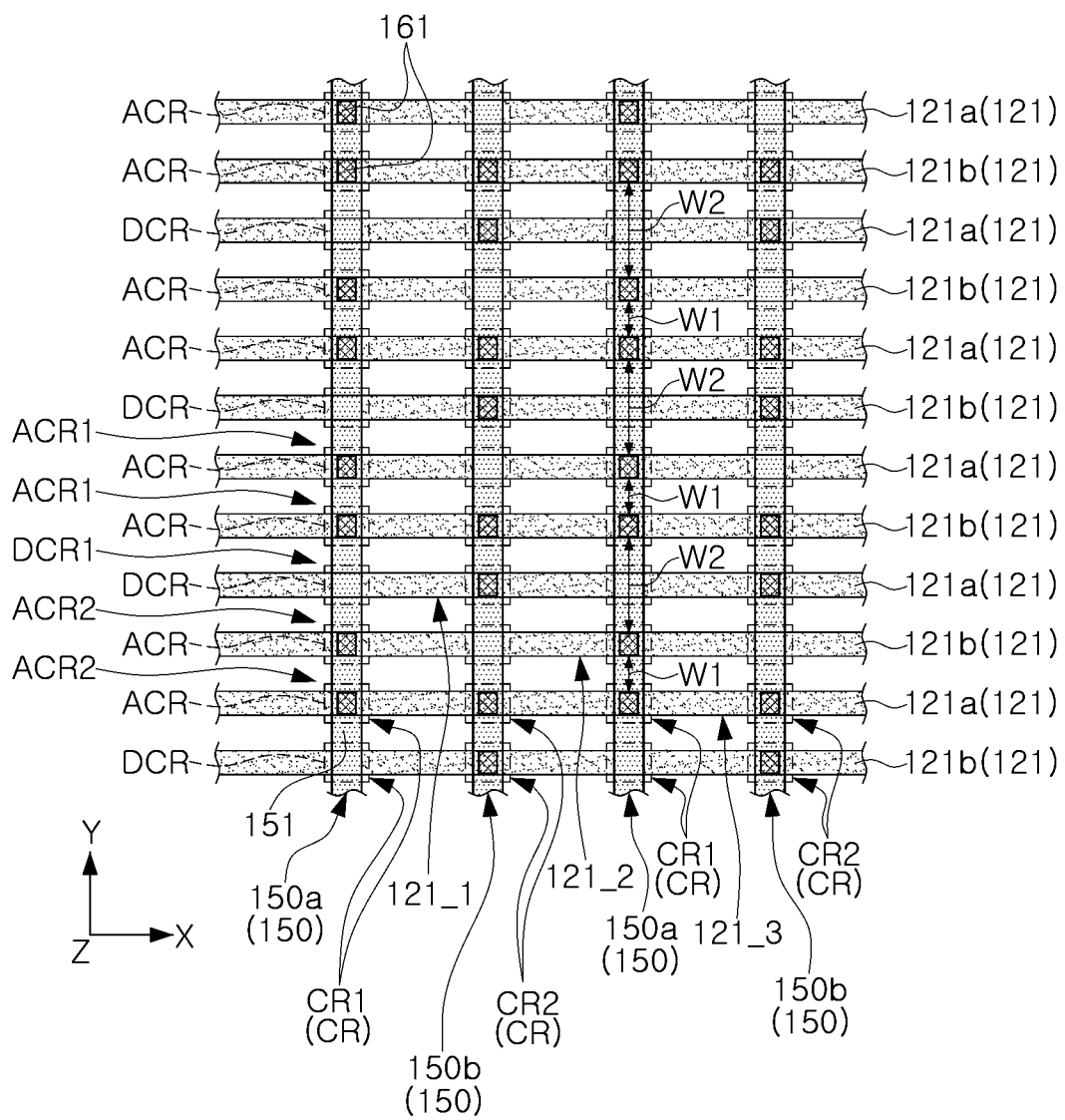
FIG. 6 is a schematic plan view of a semiconductor device according to an example embodiment of the present inventive concept.

FIG. 6 is a schematic plan view of a semiconductor device 100b according to an example embodiment of the present inventive concept. A semiconductor device 100b of FIG. 6 may have the same characteristics and structure as those described in the semiconductor device 100 of FIGS. 3A to 4B, except for an arrangement of intersection regions CR. Therefore, the overlapping description will be omitted.

Referring to FIG. 6, intersection regions CR may include active intersection regions ACR and dummy intersection regions DCR. In the plan view, through-electrodes 160 may be disposed in the active intersection regions ACR, and might not be disposed in the dummy intersection regions DCR.

In an example embodiment of the present inventive concept, the intersection regions CR may include a plurality of active intersection regions ACR and one dummy intersection region DCR, alternately and repeatedly arranged in the second horizontal direction (e.g., in the Y-direction). This may be an arrangement formed by disposing power tap cells PTC in a horizontally symmetrical manner in a design stage for manufacturing a semiconductor device, as described with reference to FIG. 2. As the plurality of active intersection regions ACR and the one dummy intersection region DCR are alternately and repeatedly arranged, an area defined by power arrangement regions 150 on a plane may be relatively reduced. Therefore, a semiconductor device having a high degree of integration may be provided by arranging circuit elements in an additionally secured region.

In an example embodiment of the present inventive concept, the power arrangement regions 150 may include first and second power arrangement regions 150a and 150b alternately arranged in the first horizontal direction (e.g., in the X-direction). The first and second power arrangement regions 150a and 150b may be disposed to be spaced apart from each other at regular or predetermined intervals. The intersection regions CR may include first intersection regions CR1, in which the first power arrangement region 150a and power lines 121 intersect each other, and second intersection regions CR2, in which the second power arrangement region 150b and power lines 121 intersect each other.

The first intersection regions CR1 may include first active intersection regions, in which the through-electrodes 160 are disposed, and a first dummy intersection region, in which the through-electrodes 160 are not disposed, and the second intersection regions CR2 may include second active intersection regions, in which the through-electrodes 160 are disposed, and a second dummy intersection region, in which the through-electrodes 160 are not disposed.

Unlike the semiconductor device 100 of FIG. 3, in the semiconductor device 100b according to the present example embodiment, the first and second dummy intersection regions might not overlap specific power lines 121.

In an example embodiment of the present inventive concept, the power lines 121 may include first to third power lines 121_1, 121_2, and 121_3, sequentially arranged in the second horizontal direction (e.g., in the Y-direction).

The number of dummy intersection regions overlapping each of the power lines 121_1, 121_2, and 121_3 or the number of through-electrodes 160 passing through each of the power lines 121_1, 121_2, and 121_3 may be different from each other. For example, the number of dummy intersection regions overlapping the third power line 121_3 may be zero (0).

For example, unlike in FIG. 3A, the semiconductor device 100b according to the present example embodiment may relatively reduce areas of the power arrangement regions 150 without considering uniformity of power performance of the power lines 121. According to example embodiments of the present inventive concept, the power performance of the power lines 121 may be uniformly implemented through some or other interconnection structures of front interconnection patterns 126 of a front interconnection structure 120.

Figure 7A:
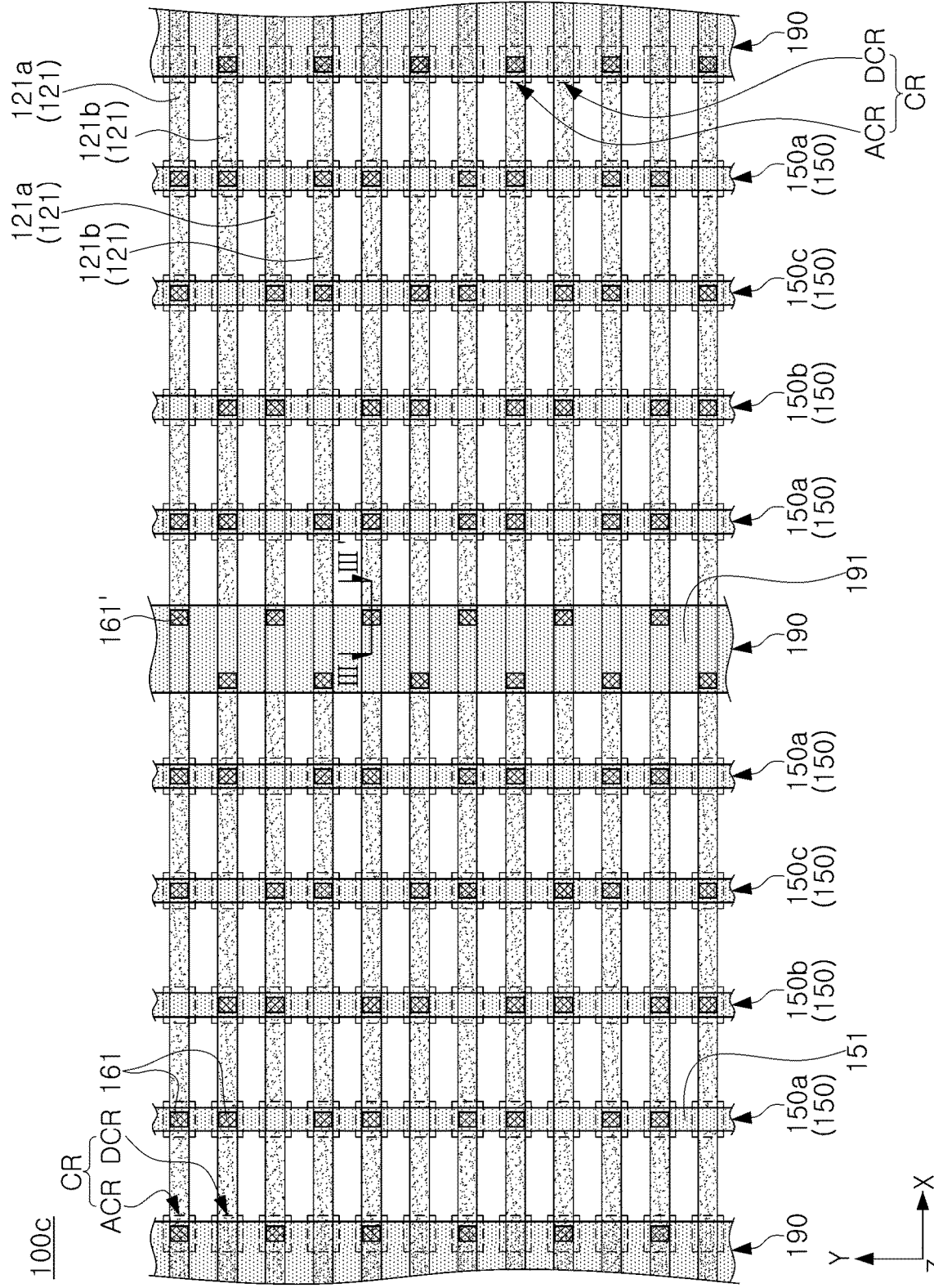
FIG. 7A is a schematic plan view of a semiconductor device according to an example embodiment of the present inventive concept.
Figure 7B:
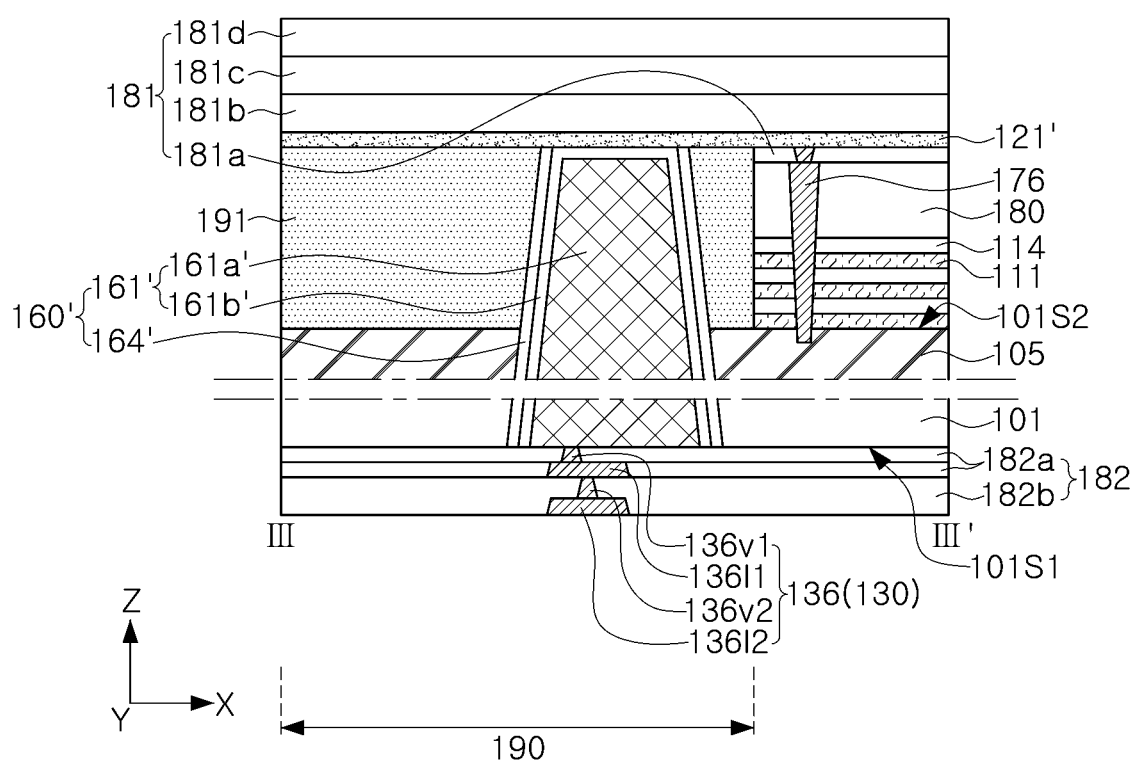
FIG. 7B is a schematic cross-sectional view of a semiconductor device according to an example embodiment of the present inventive concept.

FIGS. 7A and 7B are schematic plan views of a semiconductor device 100c according to an example embodiment of the present inventive concept.

Referring to FIGS. 7A and 7B, a semiconductor device 100c according to the present example embodiment may further include well through-electrodes 160', a well interconnection 121', and a well contact 176.

In an example embodiment of the present inventive concept, a semiconductor substrate 101 may further include well electrode arrangement regions 190 that are parallel to each other, and each of the well electrode arrangement regions 190 extends in the second horizontal direction (e.g., in the Y-direction). The well electrode arrangement regions 190 may be disposed to be spaced apart from each other in the first horizontal direction (e.g., in the X-direction). At least two or more power arrangement regions 150 may be disposed between adjacent well electrode arrangement regions 190. In the present embodiment, although it is illustrated that four power arrangement regions 150 are disposed between adjacent well electrode arrangement regions 190, the number of power arrangement regions 150 between the adjacent well electrode arrangement regions 190 is not limited thereto, and may be variously changed. In an example embodiment of the present inventive concept, a width of the well electrode arrangement regions 190 in the first horizontal direction (e.g., in the X-direction) may be wider than a width of the power arrangement regions 150 in the first horizontal direction (e.g., in the X-direction), but the present inventive concept is not limited thereto.

As the well electrode arrangement regions 190 are disposed between the plurality of power arrangement regions 150, an arrangement of dummy intersection regions DCR or through-electrodes 160 in the power arrangement regions 150 may be efficiently adjusted. Therefore, power lines 121 each having substantially uniform power performance may be provided.

In an example embodiment of the present inventive concept, the semiconductor device 100c may further include insulating structures 191 disposed on the well electrode arrangement regions 190. For example, the insulating structures 191 may completely overlap the well electrode arrangement regions 190 in the vertical direction (e.g., in the Z-direction). Each of the insulating structures 191 may have a linear shape extending in the second horizontal direction (e.g., in the Y-direction), in a similar manner to the well electrode arrangement regions 190, and may include an insulating material, such as, for example, an oxide, a nitride, a carbide, or a combination thereof. For example, the insulating structures 191 on the well electrode arrangement regions 190 may include the same material as insulating structures 151 on the power arrangement regions 150, but the present inventive concept is not limited thereto.

The well through-electrodes 160' may pass through the well electrode arrangement regions 190 to contact the well interconnection 121'. The well through-electrodes 160' may pass through at least the semiconductor substrate 101. For example, the through-electrodes 160' may pass through a first surface 101S1 and a second surface 101S2 of the semiconductor substrate 101. The well through-electrodes 160' may have a width increasing from the second surface 101S2 to the first surface 101S1 of the semiconductor substrate 101. In an example embodiment of the present inventive concept, the well through-electrodes 160' may have the same planar area and the same length as the through-electrodes 160. This may be because the well through-electrodes 160' is formed through the same process as the through-electrodes 160.

The well through-electrodes 160' may include a well through-pattern 161' and a well through-spacer 164' surrounding a side surface of the well through-pattern 161'. The well through-spacer 164' may separate the well through-pattern 161' from the semiconductor substrate 101.

The well through-pattern 161' may include a well plug layer 161a' and a well barrier layer 161b' covering a side surface and an upper surface of the well plug layer 161a'. The well barrier layer 161b' may be in contact with the well interconnection 121'. The well plug layer 161a' may include, for example, a metal nitride such as a titanium nitride film (TiN), a tantalum nitride film (TaN), or a tungsten nitride film (WN), and/or a metal material such as aluminum (Al), tungsten (W), molybdenum (Mo), or the like. The well barrier layer 161b' may include, for example, a metal nitride such as a titanium nitride film (TiN), a tantalum nitride film (TaN), or a tungsten nitride film (WN).

The well interconnection 121' may extend in the first horizontal direction (e.g., in the X-direction). The well interconnection 121' may be disposed on the same height level as the power lines 121. In an example embodiment of the present inventive concept, the well interconnection 121' may be a portion of the power lines 121, but unlike the power lines 121, the well interconnection 121' may be a separate interconnection spaced apart from the power lines 121 by disconnecting from the power lines 121 in the first horizontal direction (for example, the X-direction), or may be formed as a portion of the front interconnection patterns 126.

The well contact 176 may extend through an interlayer insulating layer 180 into the first surface 101S1 of the semiconductor substrate 101. The well contact 176 may be a contact plug contacting a well region. The well region may be a doped impurity region on the semiconductor substrate 101. The well contact 176 may be in contact with the well interconnection 121'. The well contact 176 may serve to transfer power supplied by the well through-electrodes 160 to the well region or to ground the well region.

Figure 8:
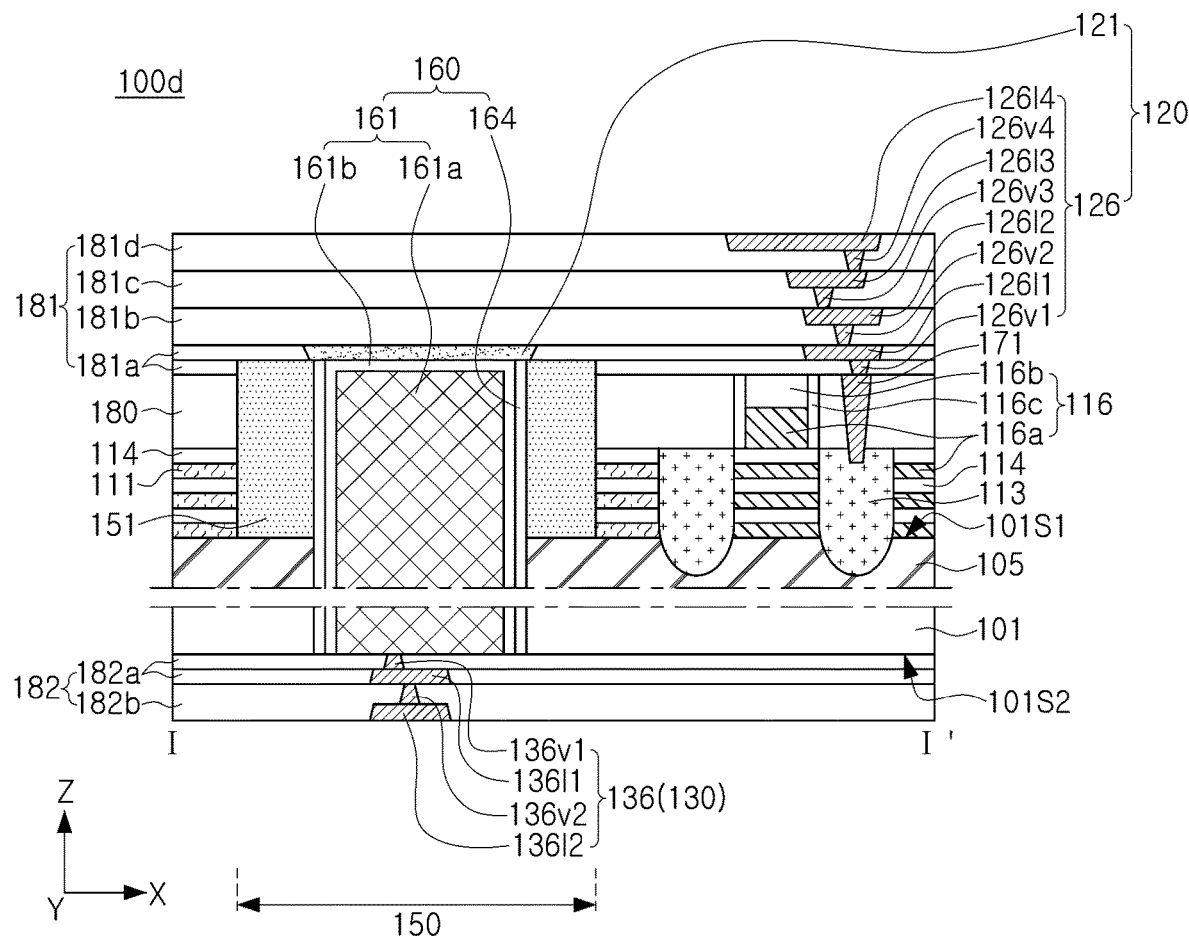
FIG. 8 is a schematic cross-sectional view of a semiconductor device according to an example embodiment of the present inventive concept.

FIG. 8 is a schematic cross-sectional view of a semiconductor device 100d according to an example embodiment of the present inventive concept.

Referring to FIG. 8, a semiconductor device 100d may have a structure of through-electrodes 160 different from that of FIG. 3A. Each of the through-electrodes 160 might not decrease in width in a direction from a second surface 101S2 to a first surface 101S1 of a semiconductor substrate 101. For example, each of the through-electrodes 160 may have a constant width.

In one example, each of the through-electrodes 160 may have a side surface extending vertically, instead of a side surface having a decreasing width.

In another example, each of the through-electrodes 160 may have an inclined side surface increasing in width in a direction from the second surface 101S2 to the first surface 101S1 of the semiconductor substrate 101. In this case, a through-pattern 161 may have a structure including a plug layer and a barrier layer covering a side surface and a lower surface of the plug layer.

Figure 9:
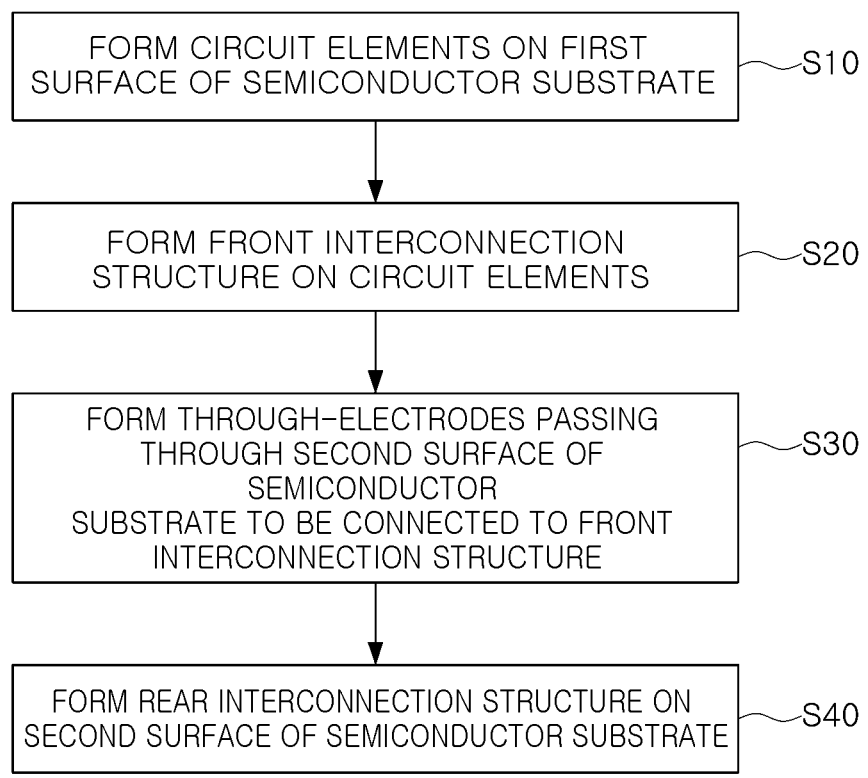
FIG. 9 is a flowchart illustrating a method of manufacturing a semiconductor device according to an example embodiment of the present inventive concept.

FIG. 9 is a flowchart illustrating a method of manufacturing a semiconductor device 100 according to an example embodiment of the present inventive concept. FIGS. 10A to 10D are views illustrating a process sequence to illustrate a method of manufacturing a semiconductor device 100 according to an example embodiment of the present inventive concept. FIGS. 10A to 10D are views corresponding to a cross-sectional view taken along line I-I' of FIG. 3C.

Figure 10A:
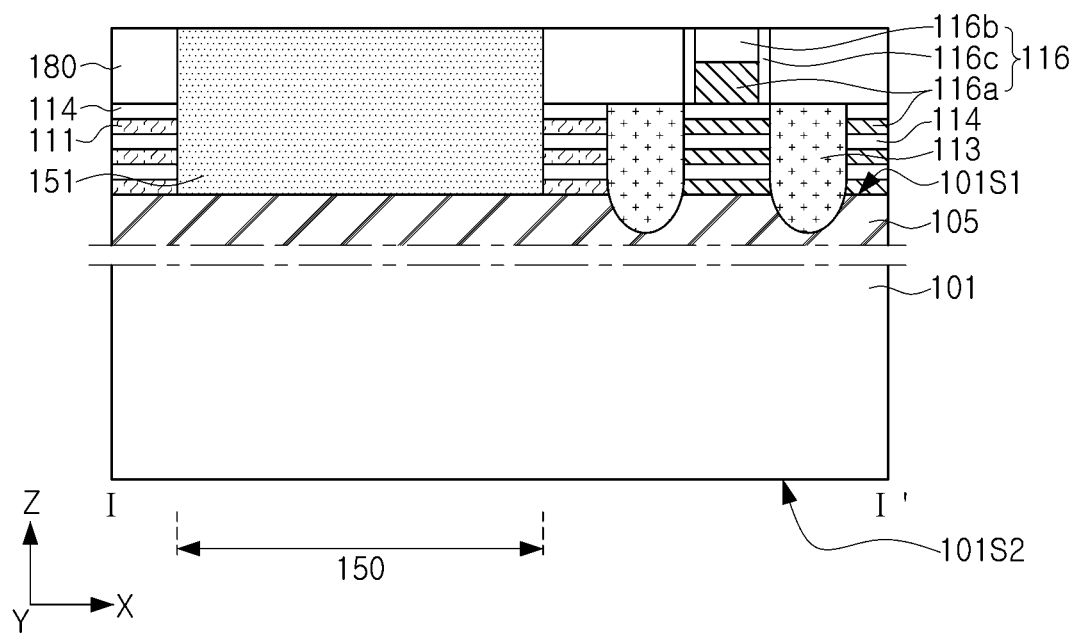
FIGS. 10A, 10B, 10C, and 10D are views illustrating a process sequence illustrating a method of manufacturing a semiconductor device according to an example embodiment of the present inventive concept.

Referring to FIGS. 9 and 10A, circuit elements may be formed on a first surface 101S1 of a semiconductor substrate 101 (S10).

First, first and second semiconductor layers 111 and 114 alternately stacked on a first surface 101S1 of a semiconductor substrate 101 having the first surface 101S1 and a second surface 101s2 opposing the first surface 101S1 may be formed. The first semiconductor layers 111 may be partially replaced with a gate electrode 116a by a subsequent process. A portion of the second semiconductor layers 114 may be used as a channel region by a subsequent process. In this specification, the second semiconductor layers 114 may be referred to as channel layers. The first semiconductor layers 111 and the channel layers 114 may be formed by an epitaxial growth process. The first semiconductor layers 111 may be formed of a material having etch selectivity with respect to the channel layers 114. The first semiconductor layers 111 and the channel layers 114 may include, for example, a semiconductor material including at least one of silicon (Si), silicon germanium (SiGe), and/or germanium (Ge), but may include different materials. The first semiconductor layers 111 may include, for example, silicon germanium (SiGe), and the channel layers 114 may include silicon (Si). In an example embodiment of the present inventive concept, three (3) channel layers 114 may be stacked to have substantially the same thickness as one another, but the present inventive concept is not limited thereto, and the number and thicknesses of the channel layers may be variously changed according to an example embodiment of the present inventive concept. Active regions 105 and field regions 107 may be formed. Trenches defining the active regions 105 may be formed. For example, the active regions 105 may be regions formed to protrude from an upper surface of the semiconductor substrate 101 by removing a portion of the semiconductor substrate 101. The active regions 105 may protrude from the semiconductor substrate 101 in the vertical direction (e.g., in the Z-direction), and may be formed of the same material as the semiconductor substrate 101. The active regions 105 may be formed to have a linear shape extending in one direction, for example, the X-direction, and may be disposed to be spaced apart from each other in the Y-direction. In this specification, the semiconductor substrate 101 may be defined to include the active regions 105, and upper surfaces of the active regions 105 may form a portion of the first surface 101S1 of the semiconductor substrate 101. After filling the trench with an insulating material, the insulating material may be partially removed such that the active regions 105 protrude. Therefore, the field regions 107 may be formed. The insulating material may include, for example, silicon oxide.

Next, sacrificial gate structures extending in a direction, intersecting the active regions 105, for example, in the Y-direction may be formed. The sacrificial gate structures may be sacrificial structures to be replaced with gate structures 116 by a subsequent process. The sacrificial gate structures may include a sacrificial gate layer including polysilicon and the like, and a sacrificial capping layer disposed on the sacrificial gate layer and including silicon nitride, but structures and materials of the sacrificial gate structures are not limited thereto, and may be changed in various manners. A gate spacer 116c may be formed on both sidewalls of each of the sacrificial gate structures. The gate spacer 116c may include an insulating material, for example, at least one of SiO, SiN, SiCN, SiOC, SiON, or SiOCN.

Next, portions of the first semiconductor layers 111 and the channel layers 114 may be etched using the sacrificial gate structures and the gate spacer 116c, as an etch mask, to expose the active regions 105, and source/drain regions 113 may be formed on the exposed active regions 105. The source/drain regions 113 may be formed on the exposed active regions 105 by an epitaxial process. In an example embodiment of the present inventive concept, the source/drain regions 113 may be formed as a plurality of layers. In addition, the source/drain regions 113 may include impurities by in-situ doping in the epitaxial process. According to an example embodiment of the present inventive concept, ex-situ doping may be separately performed in a subsequent process.

Next, an interlayer insulating layer 180 covering the source/drain regions 113 and the channel layers 114 may be formed, and the sacrificial capping layer may be removed by a planarization process. The sacrificial gate layer exposed by the removed sacrificial capping layer may be selectively removed to form upper gap regions, and then the first semiconductor layers 111 exposed through the upper gap regions may be removed to form lower gap regions. For example, when the first semiconductor layers 111 include silicon germanium (SiGe) and the channel layers 114 include silicon (Si), the first semiconductor layers 111 may be selectively removed by performing a wet etching process using, for example, peracetic acid as an etchant. A gate dielectric layer and a gate electrode 116a may be sequentially formed in the upper gap regions and the lower gap regions. A portion of the gate electrode 116a may be partially etched to remove the same, and an insulating material may be filled therein to form a gate capping layer 116b. Therefore, each of the gate structures 116 including the gate electrode 116a, the gate capping layer 116b, and the gate spacer 116c may be formed. In addition, circuit elements including the channel layers 114, the source/drain regions 113 contacting the channel layers 114, and the gate structures 116 intersecting the channel layers 114 may be formed.

In this operation, a contact plug 171 connected to the source/drain regions 113 may be formed through the interlayer insulating layer 180.

Referring to FIG. 2 together, the semiconductor substrate 101 may include power arrangement regions 150 extending in the second horizontal direction (e.g., in the Y-direction) corresponding to a power tap cell (PTC) region. The first and second semiconductor layers 111 and 114 might not be formed on the power arrangement regions 150. This may be a process of removing the first and second semiconductor layers 111 and 114 on the power arrangement regions 150 by a separate etching process, after forming the first and second semiconductor layers 111 and 114. In addition, this may be because the first and second semiconductor layers 111 and 114 are selectively deposited only on a region of the semiconductor substrate 101 excluding the power arrangement regions 150.

Insulation structures 151 passing through the interlayer insulating layer 180 and contacting the semiconductor substrate 101 may be formed on the power arrangement regions 150. The insulating structures 151 may be, for example, silicon oxide.

Figure 10B:
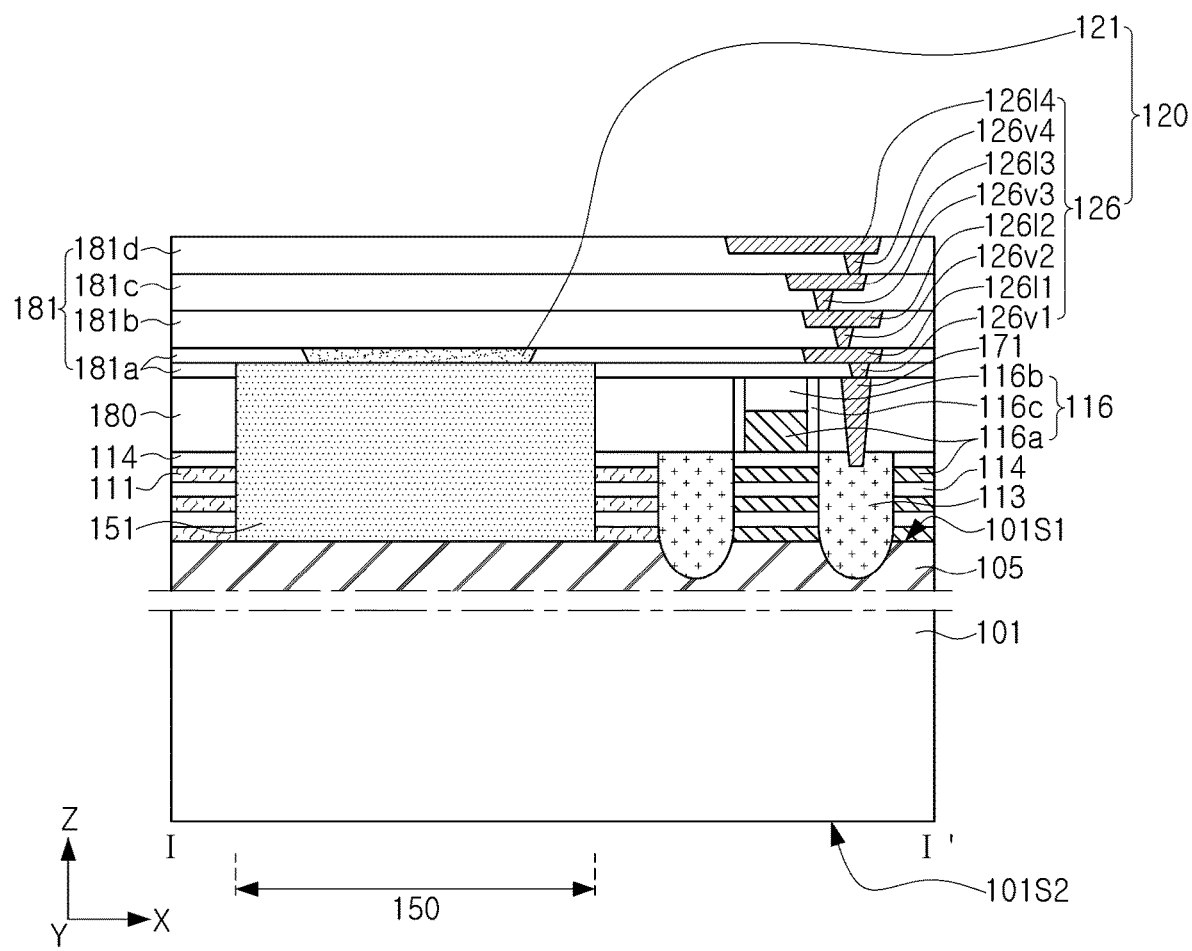

Referring to FIGS. 9 and 10B, a front interconnection structure 120 on the circuit elements may be formed (S20).

Upper insulating layers 181 and front interconnection structures 120 may be formed on the circuit elements and the interlayer insulating layer 180.

A first upper insulating layer 181a may be formed, and first front interconnection patterns 126v1 and 126/1 electrically connected to the contact plug 171 through the first upper insulating layer 181a may be formed. In an example embodiment of the present inventive concept, power lines 121 may be formed, together with the first front interconnection patterns 126v1 and 126/1. The power lines 121 may be disposed on the same height level as a first front interconnection line 126/1 among the first front interconnection patterns 126v1 and 126/1. The power lines 121 may extend in the first horizontal direction (e.g., in the X-direction). Each of the power lines 121 may be electrically connected to adjacent circuit elements.

Next, a second upper insulating layer 181b may be formed on the first upper insulating layer 181a, second front interconnection patterns 126v2 and 126/2 passing through the second upper insulating layer 181b may be formed, a third upper insulating layer 181c may be formed on the second upper insulating layer 181b, and third front interconnection patterns 126v3 and 126/3 passing through the third upper insulating layer 181c may be formed, a fourth upper insulating layer 181d may be formed on the third upper insulating layer 181c, and fourth front interconnection patterns 126v4 and 126l4 passing through the fourth upper insulating layer 181d may be formed. According to an example embodiment of the present inventive concept, the number of layers of the front interconnection patterns may be variously changed.

Figure 10C:
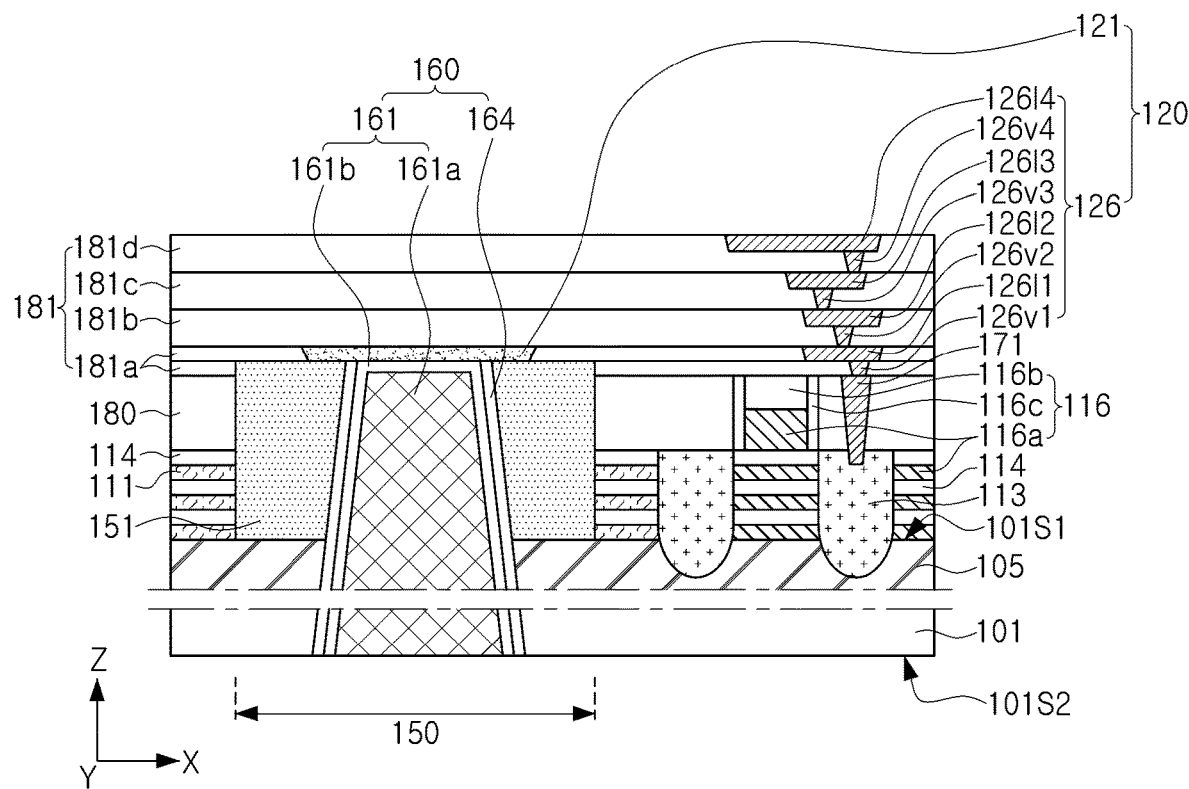

Referring to FIGS. 9 and 10C, through-electrodes 160 passing through the second surface 101S2 of the semiconductor substrate 101 to be connected to the front interconnection structure 120 may be formed (S30).

Through-electrodes 160 contacting the power lines 121 may be formed through the power arrangement regions 150. Referring to FIGS. 2 and 3A together, the through-electrodes 160 may be formed in regions corresponding to tabs PTC_C1 and PTC_C2 arranged in a layout in a design stage for manufacturing a semiconductor device. The through-electrodes 160 may be formed by forming an opening passing through the power arrangement regions 150 and the insulating structures 151 of the semiconductor substrate 101 to expose lower surfaces of the power lines 121. In addition, the forming of the through electrodes 160 may include sequentially forming a through-spacer 164 surrounding side surfaces of the openings, a barrier layer 161b conformally covering lower surfaces of the exposed power lines 121, a plug layer 161a burying a remaining space of the opening, and performing a planarization process.

Figure 10D:
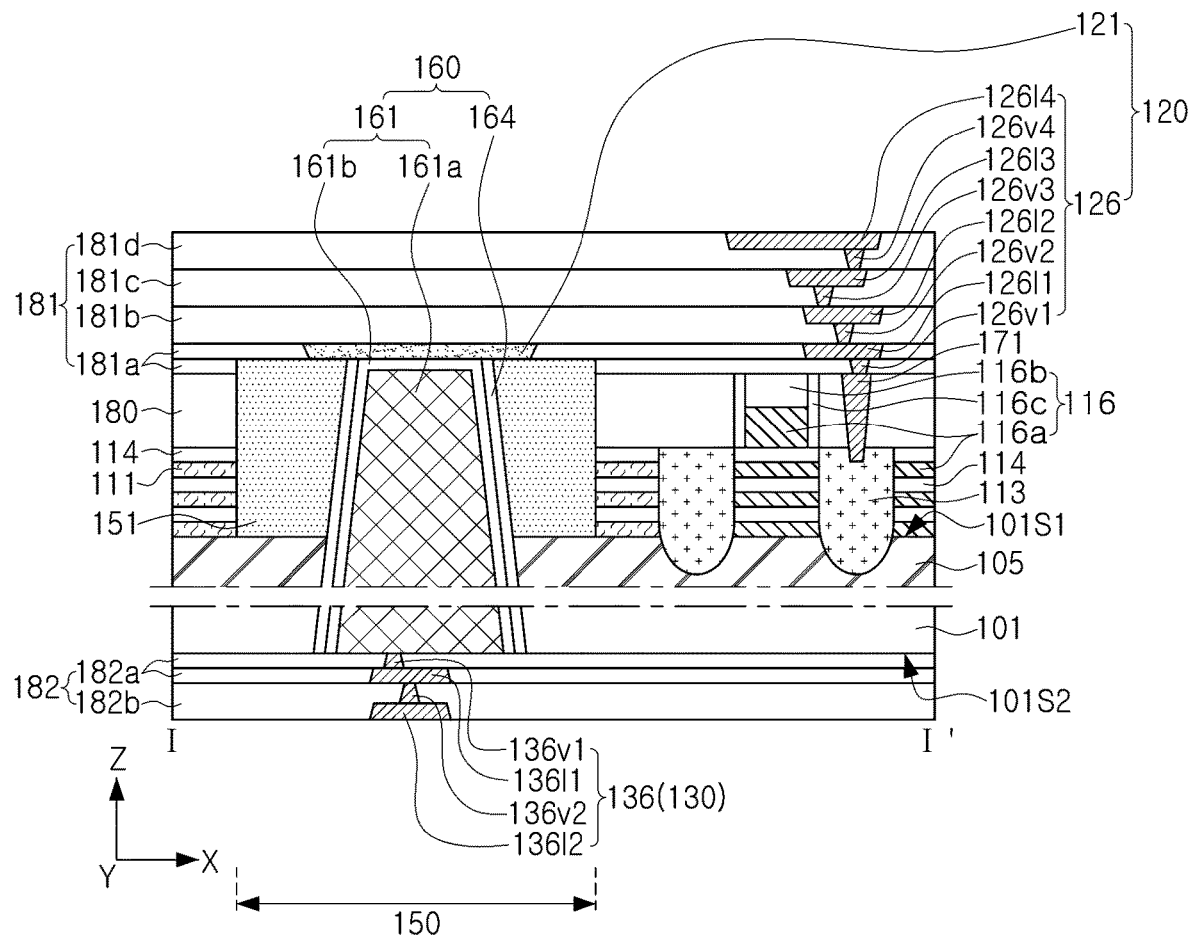

Referring to FIGS. 9 and 10D, a rear interconnection structure 130 may be formed on the second surface 101S2 of the semiconductor substrate 101 (S40).

A first lower insulating layer 182a may be formed on the second surface 101S2 of the semiconductor substrate 101, and first rear interconnection patterns 136v1 and 136l1 passing through the first lower insulating layer 182a to contact the through-electrodes 160 may be formed. A second lower insulating layer 182b may be formed on the first lower insulating layer 182a, and second rear interconnection patterns 136v2 and 136l2 passing through the second lower insulating layer 182b to contact the first rear interconnection patterns 136v1 and 136l1 may be formed. Therefore, the semiconductor device 100 of FIGS. 3A to 4B may be provided.

A semiconductor device having an increased degree of integration of standard cells may be provided by arranging power tap cell structures in a horizontally symmetrical manner to secure an additional area.

A semiconductor device having increased electrical performance may be provided by balancing power vacancy regions generated by the horizontally symmetrical arrangement.

Various effects of the present inventive concept are not limited to the above, and will be more easily understood in the process of describing example embodiments of the present inventive concept.

While the present inventive concept has been described with reference to embodiments thereof, it will be understood by those of ordinary skill in the art that various changes in form and details may be made thereto without departing from the spirit and scope of the present inventive concept.

What is claimed is:

1. A semiconductor device comprising:
    a semiconductor substrate having a first surface and a second surface, opposing each other, and having power arrangement regions;
    a circuit element disposed on the semiconductor substrate;
    a first interconnection structure disposed on the first surface of the semiconductor substrate and including first interconnection patterns and power lines;
    a second interconnection structure disposed on the second surface of the semiconductor substrate and including second interconnection patterns;
    insulating structures disposed in the power arrangement regions; and
    through-electrodes passing through each of the power arrangement regions and contacting the power lines,
    wherein the first interconnection patterns include first interconnection lines disposed on different levels from each other,
    wherein the power lines are disposed on a same height level as a first interconnection line, among the first interconnection lines, and are parallel to each other, wherein the power lines extend in a first horizontal direction,
    wherein the power arrangement regions are parallel to each other and extend in a second horizontal direction, substantially perpendicular to the first horizontal direction, and
    wherein, in a plan view, intersection regions, in which the power arrangement regions and the power lines intersect, include active intersection regions and dummy intersection regions,
    wherein the active intersection regions and the dummy intersection regions include a plurality of first active intersection regions, one dummy intersection region, and a plurality of second active intersection regions, sequentially arranged in the second horizontal direction, and
    wherein, in a plan view, the through-electrodes are disposed in the active intersection regions and are not disposed in the dummy intersection regions.

2. The semiconductor device of claim 1, wherein the plurality of first active intersection regions are a pair of intersection regions adjacent to each other in the second horizontal direction, and the plurality of second active intersection regions are a pair of intersection regions adjacent to each other in the second horizontal direction.

3. The semiconductor device of claim 1, wherein, in the active intersection regions, the through-electrode electrically connect the second interconnection patterns and the power lines to each other.

4. The semiconductor device of claim 1, wherein each of the through-electrodes comprises a plug layer and a barrier layer covering a side surface and an upper surface of the plug layer,
    wherein the barrier layer of each of the through-electrodes is in contact with the power lines.

5. The semiconductor device of claim 1, wherein each of the through-electrodes have a width decreasing from the second surface of the semiconductor substrate to the first surface of the semiconductor substrate.

6. The semiconductor device of claim 1, wherein the power arrangement regions comprise a first power arrangement region and a second power arrangement region, adjacent to each other, and
    wherein the intersection regions comprise first intersection regions, in which the first power arrangement region and the power lines intersect each other, and second intersection regions, in which the second power arrangement region and the power lines intersect each other,
    wherein the first intersection regions include first active intersection regions, in which the through-electrodes are disposed, and a first dummy intersection region, in which the through-electrodes are not disposed, wherein the second intersection regions include second active intersection regions, in which the through-electrodes are disposed, and a second dummy intersection region, in which the through-electrodes are not disposed, and wherein the first dummy intersection region and the second dummy intersection region are arranged in an oblique direction extending between the first horizontal direction and the second horizontal direction.

7. The semiconductor device of claim 1, wherein the power arrangement regions comprise first to third power arrangement regions sequentially arranged in the first horizontal direction, wherein the power lines comprise first to third power lines sequentially arranged in the second horizontal direction, wherein the intersection regions comprise first, second and third dummy intersection regions, arranged in a first oblique direction extending between the first horizontal direction and the second horizontal direction, wherein the first dummy intersection region includes an intersection region between the first power arrangement region and the first power line, wherein the second dummy intersection region includes an intersection region between the second power arrangement region and the second power line, and wherein the third dummy intersection region includes an intersection region between the third power arrangement region and the third power line.

8. The semiconductor device of claim 7, wherein the first power line is electrically connected to the through-electrodes passing through the second and third power arrangement regions, wherein the second power line is electrically connected to the through-electrodes passing through the first and third power arrangement regions, and wherein the third power line is electrically connected to the through-electrodes passing through the first and second power arrangement regions.

9. The semiconductor device of claim 1, wherein the semiconductor substrate further comprises well electrode arrangement regions, and wherein the semiconductor device further comprises:

insulating structures disposed on the semiconductor substrate in the well electrode arrangement regions; and well through-electrodes passing through each of the well electrode arrangement regions.

10. The semiconductor device of claim 9, wherein the first interconnection structure comprises: a well interconnection disposed on a same height level as the power lines; and a well contact extending from the well interconnection into the semiconductor substrate, and wherein the well through-electrodes electrically connect the well interconnection and the second interconnection patterns to each other.

11. The semiconductor device of claim 9, wherein the well electrode arrangement regions are parallel to each other, and extend in the second horizontal direction, and wherein at least two power arrangement regions among the power arrangement regions are disposed between adjacent well electrode arrangement regions among the well electrode arrangement regions.

12. The semiconductor device of claim 1, wherein each of the power lines further comprises a line portion and landing pad portions, wherein the landing pad portions contact the through-electrodes, wherein a width of each of the landing pad portions is wider than a width of the line portion.

13. The semiconductor device of claim 1, wherein a second interconnection pattern closest to the second surface of the semiconductor substrate, among the second interconnection patterns, is in contact with the through-electrodes, wherein the circuit element comprises a transistor including a gate electrode, and wherein the first interconnection line is disposed on a level higher than that of the gate electrode and is disposed closest to the first surface of the semiconductor substrate among the first interconnection lines.

14. A semiconductor device comprising:

a semiconductor substrate having a first surface and a second surface, opposing each other, and including power arrangement regions parallel to each other and extending in a second horizontal direction, substantially perpendicular to a first horizontal direction;

a circuit element disposed on the semiconductor substrate;

a front interconnection structure disposed on the first surface of the semiconductor substrate and including front interconnection patterns and power lines;

a rear interconnection structure disposed on the second surface of the semiconductor substrate and including rear interconnection patterns; and through-electrodes passing through at least the semiconductor substrate in the power arrangement regions, and contacting the power lines, wherein the front interconnection patterns include front interconnection lines disposed on different levels from each other, wherein the power lines are disposed on a same height level as a first front interconnection line, among the front interconnection lines, and are parallel to each other, wherein the power lines extend in the first horizontal direction, wherein, in a plan view, intersection regions, in which the power arrangement regions and the power lines intersect each other, include a pair of active intersection regions and a dummy intersection region, alternately and repeatedly arranged in the second horizontal direction, and wherein, in a plan view, the through-electrodes are disposed in the active intersection regions and are not disposed in the dummy intersection region.

15. The semiconductor device of claim 14, wherein the power arrangement regions comprise first to third power arrangement regions disposed at substantially equal intervals in the first horizontal direction.

16. The semiconductor device of claim 15, wherein the intersection regions comprise first intersection regions, in which the first power arrangement region and the power lines intersect each other, second intersection regions, in which the second power arrangement region and the power lines intersect each other, and third intersection regions, in which the third power arrangement region and the power lines intersect each other, wherein a first dummy intersection region of the first intersection regions, a second dummy intersection region of the second intersection regions, and a third dummy intersection region of the third intersection regions do not overlap each other in the first horizontal direction.

17. The semiconductor device of claim 15, wherein, of the intersection regions, intersection regions, in which the first power arrangement region and the power lines intersect each other, comprise a first dummy intersection region, a first active intersection region, and a second active intersection region, sequentially arranged in the second horizontal direction, wherein, of the intersection regions, intersection regions, in which the second power arrangement region and the power lines intersect each other, comprise a third active intersection region, a second dummy intersection region, and a fourth active intersection region, sequentially arranged in the second horizontal direction, wherein, of the intersection regions, intersection regions, in which the third power arrangement region and the power lines intersect each other, comprise a fifth active intersection region, a sixth active intersection region, and a third dummy intersection region, sequentially arranged in the second horizontal direction, wherein the first dummy intersection region, the third active intersection regions, and the fifth active intersection region are sequentially arranged in the first horizontal direction, wherein the first active intersection region, the second dummy intersection region, and the sixth active intersection region are sequentially arranged in the first horizontal direction, and wherein the second active intersection region, the fourth active intersection region, and the third dummy intersection region are sequentially arranged in the first horizontal direction.

18. The semiconductor device of claim 15, wherein the power lines comprise first to third power lines sequentially arranged in the second horizontal direction, and the numbers of through-electrodes in the first to third power arrangement regions respectively contacting the first to third power lines are equal to each other.

19. A semiconductor device comprising:
a semiconductor substrate having a first surface and a second surface, opposing each other, and having power arrangement regions;
a circuit element disposed the semiconductor substrate;
a front interconnection structure disposed on the first surface of the semiconductor substrate and including front interconnection patterns and power lines;
a rear interconnection structure disposed on the second surface of the semiconductor substrate and including rear interconnection patterns;
insulating structures disposed on the first surface of the semiconductor substrate and in the power arrangement regions; and
through-electrodes passing through each of the power arrangement regions and contacting the power lines,
wherein the front interconnection patterns include front interconnection lines disposed on different levels from each other,
wherein the power lines are disposed on a same height level as a first front interconnection line, among the front interconnection lines, and are parallel to each other, wherein the power lines extend in a first horizontal direction,
wherein the power arrangement regions are parallel to each other and extend in a second horizontal direction, substantially perpendicular to the first horizontal direction, and
wherein, in through-electrodes sequentially arranged in the second horizontal direction, among the through-electrodes, a pair of through-electrodes spaced apart from each other by a first interval are repeatedly arranged at a second interval, greater than the first interval.

20. The semiconductor device of claim 19, wherein the through-electrodes spaced apart from each other by the first interval, among the through-electrodes, are in contact with power lines adjacent to each other, among the power lines, respectively, wherein the through-electrodes spaced apart from each other by the second interval, among the through-electrodes, are in contact with power lines that are spaced apart from each other, among the power lines, and another power line, among the power lines, is interposed between the power lines that are spaced apart from each other.

* * * * *